United States Patent
Yamazaki et al.

(10) Patent No.: US 9,123,573 B2
(45) Date of Patent: Sep. 1, 2015

(54) OXIDE SEMICONDUCTOR STACKED FILM AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masashi Tsubuku, Atsugi (JP); Ryosuke Watanabe, Yamato (JP); Masashi Oota, Atsugi (JP); Noritaka Ishihara, Kawasaki (JP); Koki Inoue, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/527,076

(22) Filed: Oct. 29, 2014

(65) Prior Publication Data
US 2015/0048368 A1 Feb. 19, 2015

Related U.S. Application Data

(63) Continuation of application No. 13/953,428, filed on Jul. 29, 2013, now Pat. No. 8,890,159.

(30) Foreign Application Priority Data

Aug. 3, 2012 (JP) .................................. 2012-173388

(51) Int. Cl.
*H01L 29/04* (2006.01)
*H01L 31/036* (2006.01)
(Continued)

(52) U.S. Cl.
CPC ............ *H01L 29/1054* (2013.01); *H01L 22/14* (2013.01); *H01L 29/247* (2013.01);
(Continued)

(58) Field of Classification Search
CPC ........................ H01L 27/1214; H01L 29/4908
USPC .......... 257/59, 60, 72, 347, E29.117, E29.273
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Hoai V Pham
(74) *Attorney, Agent, or Firm* — Eric J. Robinson; Robinson Intellectual Property Law Office, P.C.

(57) ABSTRACT

An oxide semiconductor stacked film which does not easily cause a variation in electrical characteristics of a transistor and has high stability is provided. Further, a transistor which includes the oxide semiconductor stacked film in its channel formation region and has stable electrical characteristics is provided. An oxide semiconductor stacked film includes a first oxide semiconductor layer, a second oxide semiconductor layer, and a third oxide semiconductor layer which are sequentially stacked and each of which contains indium, gallium, and zinc. The content percentage of indium in the second oxide semiconductor layer is higher than that in the first oxide semiconductor layer and the third oxide semiconductor layer, and the absorption coefficient of the oxide semiconductor stacked film, which is measured by the CPM, is lower than or equal to $3 \times 10^{-3}$/cm in an energy range of 1.5 eV to 2.3 eV.

15 Claims, 19 Drawing Sheets

(51) Int. Cl.

| | |
|---|---|
| *H01L 31/0376* | (2006.01) |
| *H01L 31/20* | (2006.01) |
| *H01L 29/10* | (2006.01) |
| *H01L 29/24* | (2006.01) |
| *H01L 29/786* | (2006.01) |
| *H01L 21/66* | (2006.01) |
| *H01L 29/423* | (2006.01) |

(52) U.S. Cl.
CPC .... *H01L29/42356* (2013.01); *H01L 29/42384* (2013.01); *H01L 29/7869* (2013.01); *H01L 29/78693* (2013.01); *H01L 29/78696* (2013.01); *H01L 2924/0002* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,319,217 B2 | 11/2012 | Kim et al. |
| 8,421,083 B2 | 4/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0038641 A1 | 2/2010 | Imai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0140100 A1 | 6/2011 | Takata et al. |
| 2011/0156026 A1 | 6/2011 | Yamazaki et al. |
| 2011/0193083 A1 | 8/2011 | Kim et al. |
| 2011/0215328 A1 | 9/2011 | Morosawa et al. |
| 2011/0240990 A1 | 10/2011 | Yamazaki |
| 2011/0240991 A1 | 10/2011 | Yamazaki |
| 2012/0058598 A1 | 3/2012 | Yamazaki |
| 2012/0119205 A1 | 5/2012 | Taniguchi et al. |
| 2012/0138922 A1 | 6/2012 | Yamazaki et al. |
| 2012/0305913 A1 | 12/2012 | Yamazaki et al. |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009220 A1 | 1/2013 | Yamazaki et al. |
| 2013/0214273 A1 | 8/2013 | Yamazaki et al. |
| 2013/0320330 A1 | 12/2013 | Yamazaki |
| 2013/0320334 A1 | 12/2013 | Yamazaki et al. |
| 2013/0334523 A1* | 12/2013 | Yamazaki ...................... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 08-250754 A | 9/1996 |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2000-182976 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-067954 A | 3/2010 |
| JP | 2010-177431 A | 8/2010 |
| JP | 2011-243745 A | 12/2011 |
| JP | 2012-134475 A | 7/2012 |
| JP | 2012-146946 A | 8/2012 |
| JP | 2012-160679 A | 8/2012 |
| JP | 2013-102171 A | 5/2013 |
| TW | 201227964 | 7/2012 |
| TW | 201236157 | 9/2012 |
| WO | WO-2004/114391 | 12/2004 |
| WO | WO-2012/029596 | 3/2012 |
| WO | WO-2012/073844 | 6/2012 |

OTHER PUBLICATIONS

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.

International Search Report (Application No. PCT/JP2013/070950) Dated Sep. 10, 2013.

Written Opinion (Application No. PCT/JP2013/070950) Dated Sep. 10, 2013.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW'08: Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.n. et al., "Syntheses and Single-Crystal Data of Homologous Compounds, In2O3(ZnO)m (m=3, 4, and 5), InGaO3(ZnO)3, and Ga2O3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1669-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID Internaional Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous in—Ga—Zn—Oxide TFTs", IDW'09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transaction on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

* cited by examiner

OXIDE SEMICONDUCTOR STACKED FILM AND SEMICONDUCTOR DEVICE

TECHNICAL FIELD

The present invention relates to a method for manufacturing a semiconductor device including an oxide semiconductor stacked film and a field-effect transistor.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification and the like, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

Further, in Non-Patent Document 1, it has been reported that an amorphous In—Ga—Zn—O film has an extremely high density of defect states higher than or equal to $1 \times 10^{20}/\text{cm}^3$ and the defect states are reduced by almost half by heat treatment.

REFERENCE

Non-Patent Document

[Non-Patent Document 1] Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633

Patent Document

[Patent Document 1] Japanese Published Patent Application No. 2007-123861
[Patent Document 2] Japanese Published Patent Application No. 2007-096055

DISCLOSURE OF INVENTION

A transistor using an oxide semiconductor has a problem in that the electrical characteristics, typically, the threshold voltages, are varied with time or through the gate bias temperature (GBT) stress test. For example, when a transistor uses the oxide semiconductor having the density of defect states described in Non-Patent Document 1, the electrical characteristics such as the threshold voltage of the transistor may be varied.

Such a variation in electrical characteristics of a transistor causes a reduction in reliability of a semiconductor device including the transistor.

In view of the above problem, an object of one embodiment of the present invention is to provide an oxide semiconductor stacked film which does not easily cause a variation in electrical characteristics of a transistor and has high stability. Another object is to provide a transistor which includes the oxide semiconductor stacked film in its channel formation region and has stable electrical characteristics. Another object is to improve reliability of a semiconductor device including the transistor.

One embodiment of the present invention is an oxide semiconductor stacked film in which the absorption coefficient due to localized states measured by the CPM is lower than or equal to $3 \times 10^{-3}/\text{cm}$, preferably lower than or equal to $3 \times 10^{-4}/\text{cm}$ in an energy range of 1.5 eV to 2.3 eV.

One embodiment of the present invention is an oxide semiconductor stacked film including a first oxide semiconductor layer, a second oxide semiconductor layer, and a third oxide semiconductor layer which are sequentially stacked and each of which contains indium, gallium, and zinc. The content percentage of indium in the second oxide semiconductor layer is higher than that in the first oxide semiconductor layer and the third oxide semiconductor layer. The absorption coefficient of the oxide semiconductor stacked film due to localized states, which is measured by the CPM, is lower than or equal to $3 \times 10^{-3}/\text{cm}$ in an energy range of 1.5 eV to 2.3 eV.

Further, another embodiment of the present invention is a semiconductor device including a gate electrode layer, a gate insulating film over the gate electrode layer, an oxide semiconductor stacked film overlapping with the gate electrode layer with the gate insulating film interposed therebetween, and a pair of electrode layers in contact with the oxide semiconductor stacked film. The oxide semiconductor stacked film includes a first oxide semiconductor layer, a second oxide semiconductor layer, and a third oxide semiconductor layer which are sequentially stacked and each of which contains indium, gallium, and zinc. The content percentage of indium in the second oxide semiconductor layer is higher than that in the first oxide semiconductor layer and the third oxide semiconductor layer. The absorption coefficient of the oxide semiconductor stacked film due to localized states, which is measured by the CPM, is lower than or equal to $3 \times 10^{-3}/\text{cm}$ in an energy range of 1.5 eV to 2.3 eV.

In the above structure, it is preferable that an oxide insulating film be further provided over the pair of electrode layers and the oxide semiconductor stacked film.

A semiconductor device of one embodiment of the present invention includes a transistor using an oxide semiconductor stacked film or a circuit including the transistor. For example, an electronic device which includes, as a component, a semiconductor integrated circuit including an LSI, a CPU, a power device mounted in a power circuit, a memory, a thyristor, a converter, an image sensor, or the like; an electro-optical device typified by a liquid crystal display panel; or a light-emitting display device including a light-emitting element is also included in the category of the semiconductor device.

With one embodiment of the present invention, an oxide semiconductor stacked film which does not easily cause a variation in electrical characteristics of a transistor and has high stability can be provided. Further, a transistor which includes the oxide semiconductor stacked film in its channel formation region and has stable electrical characteristics can be provided. Furthermore, reliability of a semiconductor device including the transistor can be improved.

BRIEF DESCRIPTION OF DRAWINGS

In the accompanying drawings.

BEST MODE FOR CARRYING OUT THE INVENTION

Hereinafter, embodiments of the invention disclosed in this specification and the like are described in detail with reference to the accompanying drawings. However, the invention disclosed in this specification and the like is not limited to the description below, and it is easily understood by those skilled in the art that modes and details disclosed herein can be modified in various ways. Therefore, the invention disclosed in this specification and the like is not construed as being limited to the descriptions of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, an oxide semiconductor stacked film of one embodiment of the present invention is described with reference to FIGS. 1A and 1B.

Figure 1A:
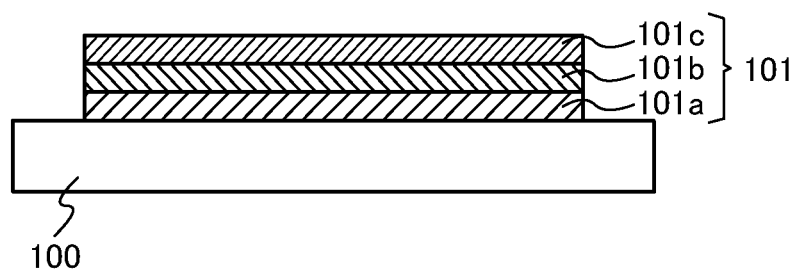
FIGS. 1A and 1B each illustrate an oxide semiconductor stacked film.

FIG. 1A illustrates an oxide semiconductor stacked film 101 provided over a substrate 100. The oxide semiconductor stacked film 101 includes a plurality of oxide semiconductor layers, and for example, a first oxide semiconductor layer 101a, a second oxide semiconductor layer 101b, and a third oxide semiconductor layer 101c are sequentially stacked in the oxide semiconductor stacked film 101.

The oxide semiconductor layers 101a to 101c each include indium, gallium, and zinc at different atomic ratios. Among the oxide semiconductor layers 101a to 101c, for example, the content percentage of indium in the second oxide semiconductor layer 101b is preferably higher than that in the first oxide semiconductor layer 101a and is preferably higher than that in the third oxide semiconductor layer 101c.

Furthermore, in the second oxide semiconductor layer 101b, the content percentage of indium is preferably higher than that of gallium.

Note that the first oxide semiconductor layer 101a and the third oxide semiconductor layer 101c may have the same atomic ratio or different atomic ratios.

For example, the first oxide semiconductor layer 101a has an atomic ratio of In:Ga:Zn=1:3:2, the second oxide semiconductor layer 101b has an atomic ratio of In:Ga:Zn=1:1:1, and the third oxide semiconductor layer 101c has an atomic ratio of In:Ga:Zn=1:3:2. Alternatively, the first oxide semiconductor layer 101a has an atomic ratio of In:Ga:Zn=1:3:2, the second oxide semiconductor layer 101b has an atomic ratio of In:Ga:Zn=3:1:2, and the third oxide semiconductor layer 101c has an atomic ratio of In:Ga:Zn=1:1:1. Note that a proportion of each atom in the atomic ratio of the oxide semiconductor layer varies within a range of ±20%, or within a range of ±10% as an error.

The second oxide semiconductor layer 101b may have a stacked-layer structure. In FIG. 1B, the second oxide semiconductor layer 101b including an oxide semiconductor layer 101b1 and an oxide semiconductor layer 101b2 is illustrated. Note that the second oxide semiconductor layer 101b may have three layers or more.

At this time, the content percentage of indium in the oxide semiconductor layers 101b1 and 101b2 is preferably higher than that in the oxide semiconductor layer 101a and is preferably higher than that in the oxide semiconductor layer 101c.

For example, it is preferable that the first oxide semiconductor layer 101a have an atomic ratio of In:Ga:Zn=1:3:2, the oxide semiconductor layer 101b1 in the second oxide semiconductor layer 101b have an atomic ratio of In:Ga:Zn=3:1:2, the oxide semiconductor layer 101b2 in the second oxide semiconductor layer 101b have an atomic ratio of In:Ga:Zn=1:1:1, and the third oxide semiconductor layer 101c have an atomic ratio of In:Ga:Zn=1:3:2. Note that a proportion of each atom in the atomic ratio of the oxide semiconductor layer varies within a range of ±20%, or within a range of ±10% as an error.

As the proportion of indium becomes higher in a metal oxide included in an oxide semiconductor, the conductivity of the metal oxide increases. For example, in the case where the content percentage of indium in the second oxide semiconductor layer 101b is higher than that in the first oxide semiconductor layer 101a and the third oxide semiconductor layer 101c, the conductivity $\sigma_2$ of the second oxide semiconductor layer 101b can be made higher than the conductivity $\sigma_1$ of the first oxide semiconductor layer 101a and the conductivity $\sigma_3$ of the third oxide semiconductor layer 101c.

The conductivity $\sigma_2$ is preferably higher than the conductivity $\sigma_1$ and the conductivity $\sigma_3$ by $1 \times 10^3$ S/cm or more, more preferably by $1 \times 10^5$ S/cm or more.

Here, the effect of using the oxide semiconductor stacked film of one embodiment of the present invention is described with reference to FIGS. 2A to 2C.

In a transistor using an oxide semiconductor, oxygen vacancies in an oxide semiconductor layer cause defects of electrical characteristics of the transistor. Thus, the oxygen vacancies in the oxide semiconductor layer need to be reduced. The oxygen vacancies in the oxide semiconductor layer can be reduced, for example, by adding oxygen to the oxide semiconductor layer or supplying oxygen from an insulating film in contact with the oxide semiconductor layer.

However, in the case where the insulating film in contact with the oxide semiconductor layer is formed using an element which is different from the element included in the oxide semiconductor layer, oxygen vacancies are easily formed at an interface between the oxide semiconductor layer and the insulating film. The oxygen vacancies which are formed between the oxide semiconductor layer and the insulating film are difficult to reduce by the above process.

The oxygen vacancies included in the oxide semiconductor layer appear as the localized states in a deep energy level of the energy gap of the oxide semiconductor.

Figure 2A:
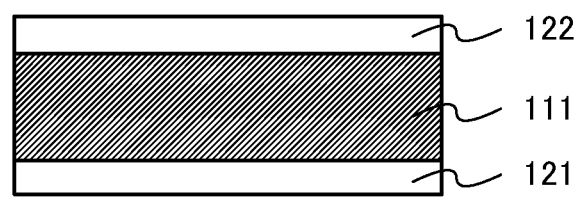
FIGS. 2A to 2C illustrate oxide semiconductor stacked films having a single-layer structure, a two-layer structure, and a three-layer structure, respectively.

For example, in the case where the oxide semiconductor layer has a single-layer structure as illustrated in FIG. 2A, oxygen vacancies are easily formed at an interface between an oxide semiconductor layer 111 and an insulating film 121 or an interface between the oxide semiconductor layer 111 and an insulating film 122. When voltage is applied from the insulating film 122 side, carriers flow in the interface between the oxide semiconductor layer 111 and the insulating film 122. In this case, when localized states due to the oxygen vacancies exist at the interface between the oxide semiconductor layer 111 and the insulating film 122, the carriers are trapped in the localized states, so that the reliability of the transistor is decreased.

Figure 2B:
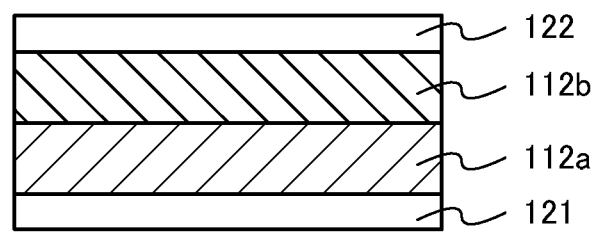

Further, in the case where the oxide semiconductor layer has a two-layer structure as illustrated in FIG. 2B, oxygen vacancies are easily formed at an interface between an oxide semiconductor layer 112a and the insulating film 121 or an interface between an oxide semiconductor layer 112b and the insulating film 122. When voltage is applied from the insulating film 122 side, carriers flow in the interface between the oxide semiconductor layer 112b and the insulating film 122. In this case, when localized states due to the oxygen vacancies exist at the interface between the oxide semiconductor layer 112b and the insulating film 122, the carriers are trapped in the localized states, so that the reliability of the transistor is decreased.

Figure 2C:
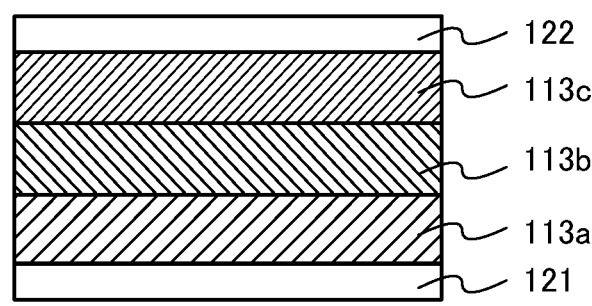

Thus, as illustrated in FIG. 2C, the oxide semiconductor layer is made to have a three-layer structure, and the conductivity of an oxide semiconductor layer 113b is made higher than that of an oxide semiconductor layer 113a and an oxide semiconductor layer 113c. With the above structure, even when voltage is applied from the insulating film 122 side, carriers do not flow in an interface between the oxide semiconductor layer 113c and the insulating film 122 but flow in an interface between the oxide semiconductor layer 113b and the oxide semiconductor layer 113c. Further, the oxide semiconductor layer 113b and the oxide semiconductor layer 113c include the same constituent elements with different atomic ratios. Thus, the amount of oxygen vacancies at the interface between the oxide semiconductor layer 113b and the oxide semiconductor layer 113c is reduced. As a result, even if carriers flow in the interface between the oxide semiconductor layer 113b and the oxide semiconductor layer 113c, the influence of the localized states due to the oxygen vacancies can be reduced.

Defects of the oxide semiconductor (oxygen vacancies) can be measured by a constant photocurrent method (CPM), for example. The CPM measurement is carried out in such a manner that the amount of light with which a surface of a sample between terminals is irradiated is adjusted in the state where voltage is applied between two electrodes included in the sample so that a photocurrent value is kept constant, and the absorption coefficient is derived from the amount of the irradiation light in each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby a density of states (hereinafter, also referred to as DOS) of the sample can be obtained.

Figure 3:
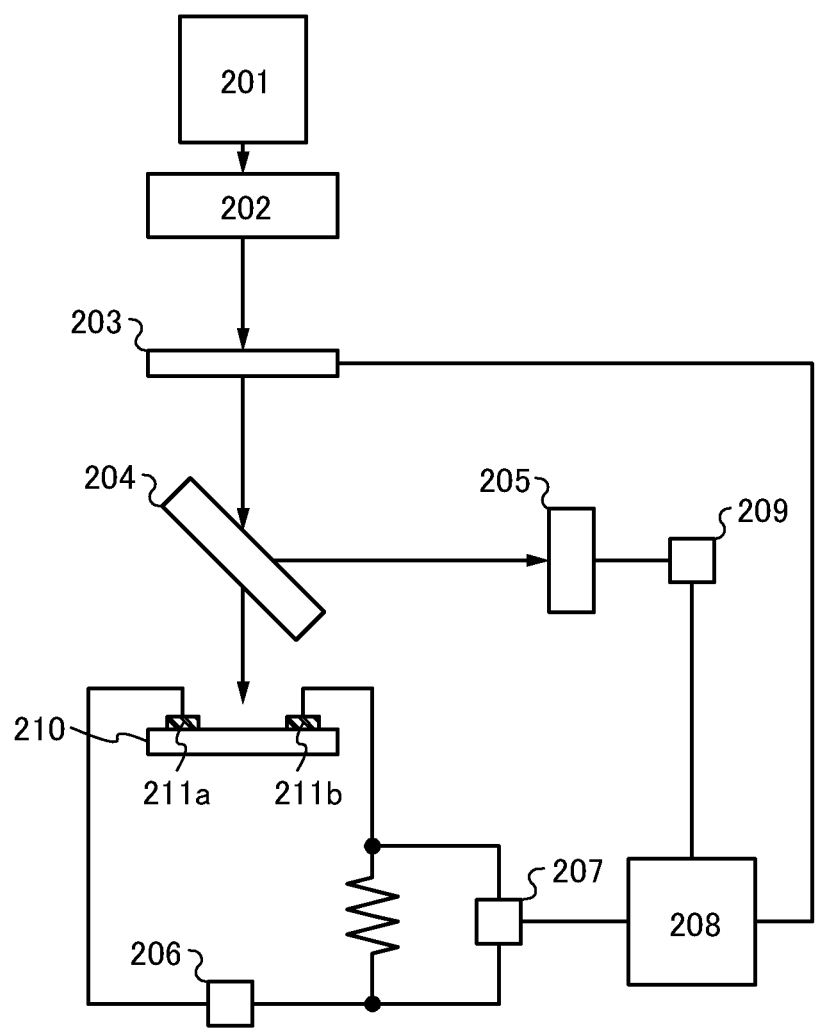
FIG. 3 illustrates a CPM measurement apparatus.

FIG. 3 illustrates a schematic view of a CPM measurement apparatus. In FIG. 3, light paths are denoted by arrows and wirings and the like are denoted by solid lines.

The CPM measurement apparatus includes a lamp 201 which is a light source, a monochromator 202 which extracts light only in a narrow wavelength range from light in a broad wavelength range, a filter 203 which attenuates light passing through the monochromator 202, a beam splitter 204 which transmits and reflects the light attenuated by the monochromator 202, a photodiode 205 which converts light into current, a lock-in amplifier 209 which measures current, and a calculator 208 which estimates the amount of the irradiation light from the measured current.

Figure 1B:
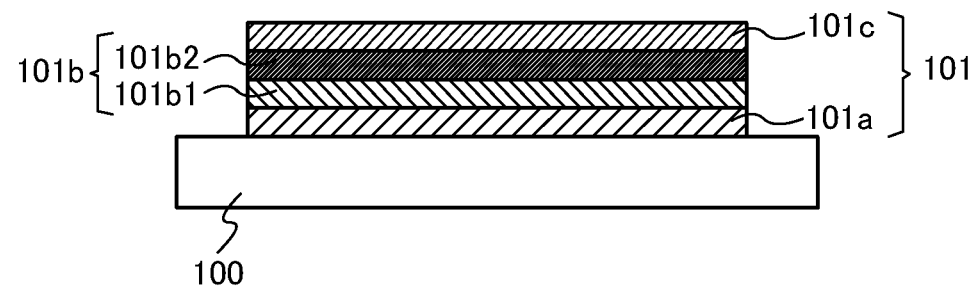

Further, a sample 210 in FIG. 3 is the oxide semiconductor stacked film 101 in FIGS. 1A and 1B. Electrodes 211a and 211b for measurement are provided on the oxide semiconductor stacked film 101. The electrodes 211a and 211b may be formed to have a single-layer structure or a stacked-layer structure using one or more of the following materials: Al, Ti, Cr, Co, Ni, Cu, Y, Zr, Mo, Ag, Ta, W, Pt, and Au, a nitride of any of these elements, an oxide of any of these elements, and an alloy of any of these elements. Alternatively, a transparent conductive film containing plural kinds of materials selected from Si, Ti, Ni, Cu, Zn, Ga, In, and Sn may be used. It is preferable to select a material which does not form an insulating film at the interface between the electrode 211a and the oxide semiconductor stacked film 101 and the interface between the electrode 211b and the oxide semiconductor stacked film 101.

The electrode 211b is connected to a direct-current power source 206 through a resistor, and a photocurrent value can be measured by a lock-in amplifier 207 connected to the resistor in parallel.

As the lamp 201, a xenon lamp, a mercury lamp, a halogen lamp, or the like can be used, for example. Any one of these lamps or a combination thereof may be used. The xenon lamp is preferable because it allows measurement to be carried out in the range of 1.5 eV to 4.0 eV.

As the filter 203, a neutral density (ND) filter, a wedge filter, a cut filter, or the like can be used. A cut filter is an optical filter which has a function of transmitting light in a specific wavelength range and attenuating light in the other wavelength range. Further, by using the above filters in combination, the amount of the irradiation light or the irradiation wavelength can be controlled more effectively. Note that the filter 203 is not necessarily provided.

The lock-in amplifier 207 and the lock-in amplifier 209 each have a function of amplifying, detecting, and outputting a signal with a specific frequency of the inputted signals. Thus, the influence of noise or the like is reduced and the signal can be detected in a high sensitivity.

The light emitted from the lamp 201 enters the monochromator 202, whereby light only in a narrow wavelength range is extracted from the light in a broad wavelength range. The light passing through the monochromator 202 is attenuated by entering the filter 203. The attenuated light is emitted to the beam splitter 204, whereby the transmitted light is emitted to the sample 210 and the reflected light is emitted to the photodiode 205. Note that the transmitted light and the reflected light are not necessarily emitted to the sample 210 and the photodiode 205, respectively, and can be reversed.

The emitted light is converted into current by the photodiode 205. After that, the current is measured by the lock-in amplifier 209, and the amount of the irradiation light can be estimated by the calculator 208. Further, the photocurrent value is measured from the light emitted to the sample 210 by the lock-in amplifier 207. The obtained photocurrent value is fed back to the filter 203 by the calculator 208. When the photocurrent value is too high, the transmittance of the filter 203 is decreased to reduce the amount of the irradiation light. When the photocurrent value is too low, the transmittance of the filter 203 is increased to increase the amount of the irradiation light.

The absorption coefficient which is called an urbach tail due to the band tail is removed from a curve of the absorption coefficient obtained by the CPM measurement, whereby the absorption coefficient due to the localized states can be calculated from the following formula.

$$\int \frac{\alpha(E) - \alpha_u}{E} dE \qquad \text{[FORMULA 1]}$$

Here, $\alpha(E)$ indicates the absorption coefficient at each energy level and $\alpha_u$ indicates the absorption coefficient due to the urbach tail.

The oxide semiconductor layers are stacked as illustrated in FIGS. 1A and 1B, whereby the absorption coefficient due to the localized states measured by the CPM can be made lower than or equal to $3 \times 10^{-3}$/cm, preferably lower than or equal to $3 \times 10^{-4}$/cm in an energy range of 1.5 eV to 2.3 eV.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of c-axis aligned crystal parts.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface where the CAAC-OS layer is formed (hereinafter, a surface where the CAAC-OS layer is formed is referred to as a formation surface) or a top surface of the CAAC-OS layer, and is arranged in parallel to the formation surface or the top surface of the CAAC-OS layer.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

Most of the crystal parts included in the CAAC-OS layer each fit inside a cube whose one side is less than 100 nm. Thus, there is a case where a crystal part included in the CAAC-OS layer fits inside a cube whose one side is less than 10 nm, less than 5 nm, or less than 3 nm. Note that when a plurality of crystal parts included in the CAAC-OS layer are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕ scan) is performed under conditions where the sample is rotated around a normal vector of a sample surface as an axis (ϕ axis) with 2θ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when ϕ scan is performed with 2θ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

In the CAAC-OS layer, distribution of c-axis aligned crystal parts is not necessarily uniform. For example, in the case where crystal growth leading to the crystal parts of the CAAC-OS layer occurs from the vicinity of the top surface of the layer, the proportion of the c-axis aligned crystal parts in the vicinity of the top surface is higher than that in the vicinity of the formation surface in some cases. Further, when an impurity is added to the CAAC-OS layer, a region to which the impurity is added is altered, and the proportion of the c-axis aligned crystal parts in the CAAC-OS layer varies depending on regions, in some cases.

Note that when the CAAC-OS layer with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS layer. It is preferable that in the CAAC-OS layer, a peak of $2\theta$ appear at around 31° and a peak of $2\theta$ do not appear at around 36°.

The CAAC-OS layer is an oxide semiconductor layer having a low impurity concentration. The impurity means an element other than main components of the oxide semiconductor layer, such as hydrogen, carbon, silicon, or a transition metal element. In particular, an element (e.g., silicon) having higher strength of bonding to oxygen than a metal element included in the oxide semiconductor layer takes oxygen away in the oxide semiconductor layer to disrupt the atomic arrangement in the oxide semiconductor layer, which causes a lowering of the crystallinity of the oxide semiconductor layer. A heavy metal such as iron or nickel, argon, carbon dioxide, or the like has a large atomic radius (or molecular radius), and thus disrupts the atomic arrangement in the oxide semiconductor layer when included in the oxide semiconductor layer, which causes a lowering of the crystallinity of the oxide semiconductor layer. Note that the impurity included in the oxide semiconductor layer serves as a carrier trap or a carrier generation source in some cases.

The CAAC-OS layer is an oxide semiconductor layer having a low density of defect states. For example, oxygen vacancies in the oxide semiconductor layer serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor layer has few carrier generation sources, and thus has a low carrier density. Thus, a transistor including the oxide semiconductor layer rarely has a negative threshold voltage (rarely has normally-on characteristics). A highly purified intrinsic or substantially highly purified intrinsic oxide semiconductor layer has few carrier traps. Thus, the transistor including the oxide semiconductor layer has a small variation in electric characteristics and accordingly has high reliability. Charges trapped by the carrier traps in the oxide semiconductor layer take a long time to be released and may behave like fixed charges. Thus, the transistor including the oxide semiconductor layer with a high impurity concentration and a high density of defect states has unstable electric characteristics in some cases.

In a transistor using the CAAC-OS layer, change in electric characteristics due to irradiation with visible light or ultraviolet light is small.

Next, a microcrystalline oxide semiconductor layer is described.

In an image obtained with a TEM, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly detected in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS layer; thus, the orientation of the whole layer is not observed. Accordingly, in some cases, the nc-OS layer cannot be distinguished from an amorphous oxide semiconductor depending on an analysis method. For example, when the nc-OS layer is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS layer obtained by using an electron beam having a diameter (e.g., larger than or equal to 50 nm) larger than that of a crystal part. Meanwhile, spots are shown in a nanobeam electron diffraction pattern of the nc-OS layer obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS layer, regions with high luminance in a circular (ring) pattern are shown in some cases. Also in a nanobeam electron diffraction pattern of the nc-OS layer, a plurality of spots is shown in a ring-like region in some cases.

Since the nc-OS layer is an oxide semiconductor layer having more regularity than the amorphous oxide semiconductor layer, the nc-OS layer has a lower density of defect states than the amorphous oxide semiconductor layer. However, there is no regularity of crystal orientation between different crystal parts in the nc-OS layer; hence, the nc-OS layer has a higher density of defect states than the CAAC-OS layer.

Each of the oxide semiconductor layers $101a$ to $101c$ is formed using, for example, any of an amorphous oxide semiconductor layer, a microcrystalline oxide semiconductor layer, and a CAAC-OS layer.

Oxide semiconductors having different crystallinities may be used for the oxide semiconductor layers $101a$ to $101c$. That is, the oxide semiconductor layers $101a$ to $101c$ may be formed using any of a microcrystalline oxide semiconductor, an amorphous oxide semiconductor, and a CAAC-OS, as appropriate. By using a CAAC-OS for the oxide semiconductor layer $101b$, oxygen vacancies in the film can be further reduced, which is preferable.

In an amorphous oxide semiconductor, impurities are easily captured and accordingly, the carrier density tends to increase; thus, relatively high field-effect mobility can be obtained with relative ease.

The crystallinity of an oxide semiconductor layer can be increased by deposition of the oxide semiconductor layer on a flat surface. For example, the oxide semiconductor layer is favorably formed on a surface with an average surface roughness ($R_a$) of 1 nm or less, preferably 0.3 nm or less, more preferably 0.1 nm or less.

Note that $R_a$ is obtained by expanding arithmetic mean surface roughness, which is defined by JIS B 0601:2001 (ISO4287:1997), into three dimensions so as to be applied to a curved surface, and is an average value of the absolute values of deviations from a reference surface to a specific surface. Here, $R_a$ can be expressed as an "average value of the absolute values of deviations from a reference surface to a specific surface" and is defined by the following formula.

$$Ra = \frac{1}{S_0}\int_{y_1}^{y_2}\int_{x_1}^{x_2}|f(x,y) - Z_0|dxdy \quad \text{[FORMULA 2]}$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Further, $S_0$ represents the area of a rectangle obtained by projecting the specific surface on the xy plane, and $Z_0$ represents the height of the reference surface (the average height of the specific surface). Note that $R_a$ can be measured using an atomic force microscope (AFM).

The thickness of each of the first oxide semiconductor layer 101a, the second oxide semiconductor layer 101b, and the third oxide semiconductor layer 101c is preferably greater than or equal to 1 nm and less than or equal to 50 nm, more preferably greater than or equal to 5 nm and less than or equal to 20 nm.

The structures, methods, and the like described in this embodiment can be combined as appropriate with any of the other structures, methods, and the like described in the other embodiments.

Embodiment 2

In this embodiment, embodiments of semiconductor devices of one embodiment of the present invention are described with reference to FIGS. 4A to 4C, FIGS. 5A and 5B, FIGS. 6A and 6B, and FIGS. 7A and 7B.

There is no particular limitation on the structure of the transistor included in a semiconductor device of one embodiment of the present invention; for example, a staggered type or a planar type having a top-gate structure or a bottom-gate structure can be employed. Further, the transistor may have a single-gate structure including one channel formation region, or a multi-gate structure such as a double-gate structure including two channel formation regions or a triple-gate structure including three channel formation regions. Alternatively, the transistor may have a dual-gate structure including two gate electrode layers positioned above and below a channel formation region with a gate insulating film provided therebetween.

Figure 4A:
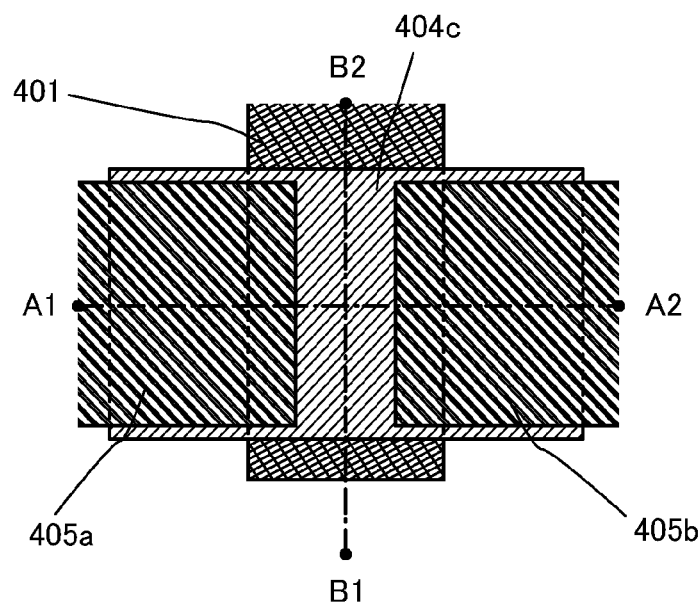
FIGS. 4A to 4C are a plan view and cross-sectional views illustrating a semiconductor device.
Figure 4C:
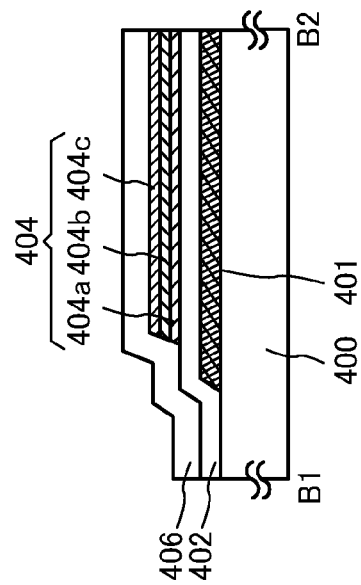
Figure 4B:
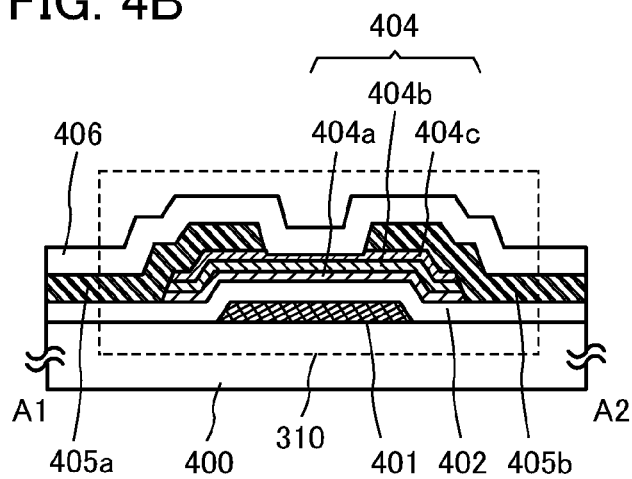

FIGS. 4A to 4C illustrate a structural example of a bottom-gate transistor 310. FIG. 4A is a plan view of the transistor 310, FIG. 4B is a cross-sectional view taken along a dashed-dotted line A1-A2 in FIG. 4A, and FIG. 4C is a cross-sectional view taken along a dashed-dotted line B1-B2 in FIG. 4A.

The transistor 310 includes a gate electrode layer 401 provided over a substrate 400 having an insulating surface, a gate insulating film 402 provided over the gate electrode layer 401, an oxide semiconductor stacked film 404 overlapping with the gate electrode layer 401 with the gate insulating film 402 interposed therebetween, and a source electrode layer 405a and a drain electrode layer 405b which are provided in contact with the oxide semiconductor stacked film 404. Further, an insulating film 406 is provided to cover the source electrode layer 405a and the drain electrode layer 405b and to be in contact with the oxide semiconductor stacked film 404.

As the oxide semiconductor stacked film 404, the oxide semiconductor stacked film illustrated in Embodiment 1, in which a plurality of oxide semiconductor layers is stacked, can be used. The oxide semiconductor stacked film 404 includes, for example, indium, gallium, and zinc, and has a structure in which a first oxide semiconductor layer 404a, a second oxide semiconductor layer 404b, and a third oxide semiconductor layer 404c are sequentially stacked. Note that in this embodiment, the oxide semiconductor stacked film has a three-layer structure as illustrated in FIG. 1A; however, like in the oxide semiconductor stacked film illustrated in FIG. 1B, the second semiconductor layer may further have a stacked-layer structure.

In the oxide semiconductor stacked film 404, the content percentage of indium in the oxide semiconductor layer 404b is preferably higher than that in the oxide semiconductor layer 404a and is preferably higher than that in the oxide semiconductor layer 404c.

Furthermore, in the oxide semiconductor layer 404b, the content percentage of indium is preferably higher than that of gallium.

For example, it is preferable that the oxide semiconductor layer 404a have an atomic ratio of In:Ga:Zn=1:3:2, the oxide semiconductor layer 404b have an atomic ratio of In:Ga:Zn=1:1:1, and the oxide semiconductor layer 404c have an atomic ratio of In:Ga:Zn=1:3:2. Note that a proportion of each atom in the atomic ratio of the oxide semiconductor layer varies within a range of ±20%, or within a range of ±10% as an error.

As the proportion of indium becomes higher in a metal oxide included in an oxide semiconductor, the conductivity of the metal oxide increases. For example, in the case where the content percentage of indium in the second oxide semiconductor layer 404b is higher than that in the first oxide semiconductor layer 404a and the third oxide semiconductor layer 404c, the conductivity $\sigma_2$ of the second oxide semiconductor layer 404b can be made higher than the conductivity $\sigma_1$ of the first oxide semiconductor layer 404a and the conductivity $\sigma_3$ of the third oxide semiconductor layer 404c.

The conductivity $\sigma_2$ is higher than the conductivity $\sigma_1$ and the conductivity $\sigma_3$ by $1\times10^3$ S/cm or more, preferably by $1\times10^5$ S/cm or more.

The oxide semiconductor stacked film 404 has the above stacked-layer structure, whereby the absorption coefficient due to the localized states measured by the CPM is lower than or equal to $3\times10^{-3}$/cm, preferably lower than or equal to $3\times10^{-4}$/cm.

Each of the oxide semiconductor layers 404a to 404c is preferably formed using any of an amorphous oxide semiconductor, a single crystal oxide semiconductor, a polycrystalline oxide semiconductor, and a CAAC-OS. Further, oxide semiconductors having different crystallinities may be used for the oxide semiconductor layers 404a to 404c. That is, the oxide semiconductor layers 404a to 404c may be formed using a combination of any of a single crystal oxide semiconductor, a polycrystalline oxide semiconductor, an amorphous oxide semiconductor, and a CAAC-OS as appropriate. By using a CAAC-OS for the oxide semiconductor layer 404b, oxygen vacancies in the film can be further reduced, which is preferable.

In the case where the thickness of the first oxide semiconductor layer 404a which is provided on the gate electrode layer 401 side is too large, when voltage is applied to the gate electrode layer 401, carriers do not flow in an interface between the first oxide semiconductor layer 404a and the second oxide semiconductor layer 404b and flow through the first oxide semiconductor layer 404a. The thickness of each of the first oxide semiconductor layer 404a, the second oxide semiconductor layer 404b, and the third oxide semiconductor layer 404c is preferably greater than or equal to 1 nm and less than or equal to 50 nm, more preferably greater than or equal to 5 nm and less than or equal to 20 nm. For example, it is preferable that the thickness of the first oxide semiconductor layer 404a be greater than or equal to 5 nm and less than or equal to 15 nm, the thickness of the second oxide semiconductor layer 404b be greater than or equal to 15 nm and less than or equal to 35 nm, and the thickness of the third oxide semiconductor layer 404c be greater than or equal to 20 nm and less than or equal to 40 nm.

In the bottom-gate transistor 310, the conductivity of the oxide semiconductor layer 404b is made higher than that of the oxide semiconductor layer 404a and the oxide semiconductor layer 404c. With such a structure, even when voltage is applied to the gate electrode layer 401, carriers do not flow in an interface between the oxide semiconductor layer 404a and the gate insulating film 402 but flow in an interface between the oxide semiconductor layer 404b and the oxide semiconductor layer 404a. Further, the oxide semiconductor layer 404b and the oxide semiconductor layer 404a include the same constituent elements with different atomic ratios. Thus, oxygen vacancies at the interface between the oxide semiconductor layer 404b and the oxide semiconductor layer 404a are reduced. As a result, even if carriers flow in the interface between the oxide semiconductor layer 404b and the oxide semiconductor layer 404a, the influence of the localized states due to the oxygen vacancies can be reduced. Accordingly, a variation in electrical characteristics of a transistor can be suppressed and a transistor with high reliability can be obtained.

Figure 5A:
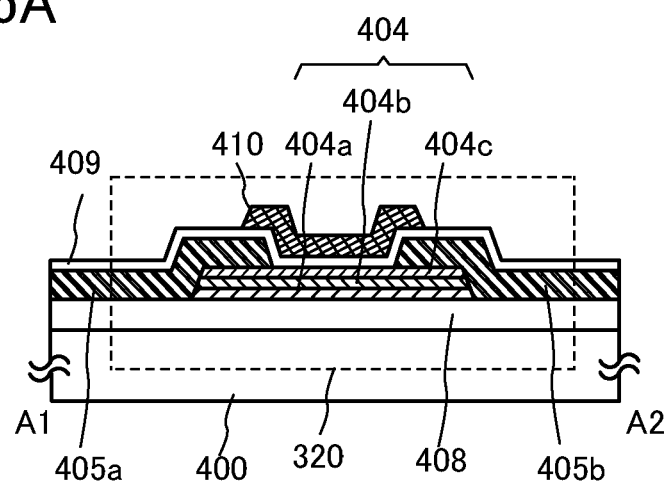
FIGS. 5A and 5B are cross-sectional views each illustrating a semiconductor device.

FIG. 5A illustrates a top-gate transistor 320.

The transistor 320 includes an insulating film 408 provided over the substrate 400 having an insulating surface, the oxide semiconductor stacked film 404 provided over the insulating film 408, the source electrode layer 405a and the drain electrode layer 405b which are provided in contact with the oxide semiconductor stacked film 404, a gate insulating film 409 provided over the oxide semiconductor stacked film 404, the source electrode layer 405a, and the drain electrode layer 405b, and a gate electrode layer 410 overlapping with the oxide semiconductor stacked film 404 with the gate insulating film 409 interposed therebetween.

In the oxide semiconductor stacked film 404 in the transistor 320 illustrated in FIG. 5A, the oxide semiconductor layer 404a, the oxide semiconductor layer 404b, and the oxide semiconductor layer 404c are stacked in this order.

In the case where the thickness of the third oxide semiconductor layer 404c which is provided on the gate electrode layer 410 side is too large, when voltage is applied to the gate electrode layer 410, carriers do not flow in an interface between the third oxide semiconductor layer 404c and the second oxide semiconductor layer 404b and flow through the third oxide semiconductor layer 404c. The thickness of each of the first oxide semiconductor layer 404a, the second oxide semiconductor layer 404b, and the third oxide semiconductor layer 404c is preferably greater than or equal to 1 nm and less than or equal to 50 nm, more preferably greater than or equal to 5 nm and less than or equal to 20 nm. For example, it is preferable that the thickness of the first oxide semiconductor layer 404a be greater than or equal to 20 nm and less than or equal to 40 nm, the thickness of the second oxide semiconductor layer 404b be greater than or equal to 15 nm and less than or equal to 35 nm, and the thickness of the third oxide semiconductor layer 404c be greater than or equal to 5 nm and less than or equal to 15 nm.

Also in the top-gate transistor 320, the conductivity of the oxide semiconductor layer 404b is made higher than that of the oxide semiconductor layer 404a and an oxide semiconductor layer 404c. With such a structure, even when voltage is applied to the gate electrode layer 410, carriers do not flow in an interface between the oxide semiconductor layer 404c and the gate insulating film 409 but flow in an interface between the oxide semiconductor layer 404b and the oxide semiconductor layer 404c. Further, the oxide semiconductor layer 404b and the oxide semiconductor layer 404c include the same constituent elements with different atomic ratios. Thus, oxygen vacancies at the interface between the oxide semiconductor layer 404b and the oxide semiconductor layer 404c are reduced. As a result, even if carriers flow in the interface between the oxide semiconductor layer 404c and the oxide semiconductor layer 404b, the influence of the localized states due to the oxygen vacancies can be reduced. Accordingly, a variation in electrical characteristics of a transistor can be suppressed and a transistor with high reliability can be obtained.

Figure 5B:
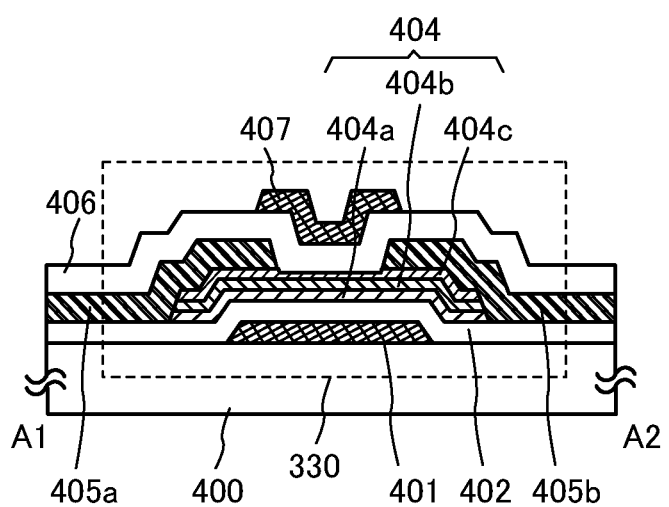

FIG. 5B illustrates a dual-gate transistor 330 including two gate electrode layers positioned above and below a channel formation region with a gate insulating film interposed therebetween.

The transistor 330 includes the gate electrode layer 401 provided over the substrate 400 having an insulating surface, the gate insulating film 402 provided over the gate electrode layer 401, the oxide semiconductor stacked film 404 overlapping with the gate electrode layer 401 with the gate insulating film 402 interposed therebetween, the source electrode layer 405a and the drain electrode layer 405b which are provided in contact with the oxide semiconductor stacked film 404, the insulating film 406 which covers the source electrode layer 405a and the drain electrode layer 405b and is in contact with the oxide semiconductor stacked film 404, and an electrode layer 407 overlapping with the oxide semiconductor stacked film 404 with the insulating film 406 interposed therebetween.

In the transistor 330, the insulating film 406 serves as a gate insulating film and the electrode layer 407 serves as a gate electrode layer. A signal for controlling an on state and an off state of the transistor is supplied to one of the pair of gate electrode layers, and the other of the gate electrode layers may be electrically insulated to be in a floating state, or may be in a state where a potential is supplied from another element. In the latter case, potentials with the same level may be supplied to both of the gate electrode layers, or a fixed potential such as a ground potential may be supplied only to the other gate electrode layer. By controlling the level of potential supplied to the other gate electrodes, the threshold voltage of the transistor 330 can be controlled.

In the oxide semiconductor stacked film 404 in the transistor 330 illustrated in FIG. 5B, the oxide semiconductor layer 404a, the oxide semiconductor layer 404b, and the oxide semiconductor layer 404c are stacked in this order.

Also in the dual-gate transistor 330, the conductivity of the oxide semiconductor layer 404b is made higher than that of the oxide semiconductor layer 404a and the oxide semiconductor layer 404c. With such a structure, even when voltage is applied to the gate electrode layer 410, carriers do not flow in an interface between the oxide semiconductor layer 404c and the gate insulating film 409 but flow in an interface between the oxide semiconductor layer 404b and the oxide semiconductor layer 404c. Further, the oxide semiconductor layer 404b and the oxide semiconductor layer 404c include the same constituent elements with different atomic ratios. Thus, oxygen vacancies at the interface between the oxide semiconductor layer 404b and the oxide semiconductor layer 404c are reduced. As a result, even if carriers flow in the interface between the oxide semiconductor layer 404c and the oxide semiconductor layer 404b, the influence of the localized states due to the oxygen vacancies can be reduced. Accordingly, a variation in electrical characteristics of a transistor can be suppressed and a transistor with high reliability can be obtained.

Here, the energy band structures of a single oxide semiconductor layer and stacked oxide semiconductor layers are described with reference to FIGS. 6A and 6B and FIGS. 7A and 7B.

Figure 6A:
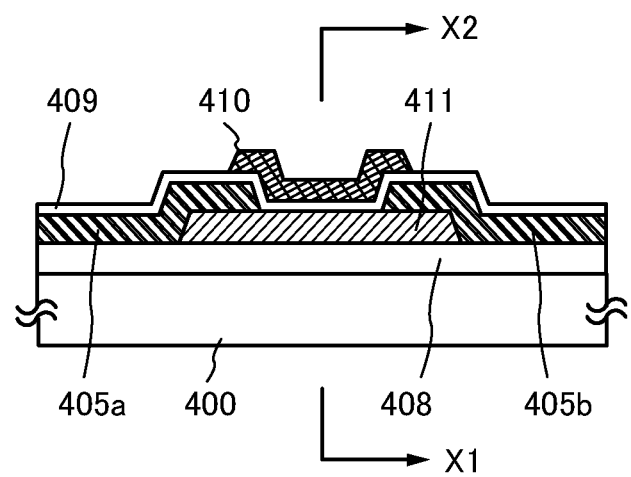
FIGS. 6A and 6B are a cross-sectional view and an energy band diagram of an oxide semiconductor stacked film having a single-layer structure.
Figure 6B:
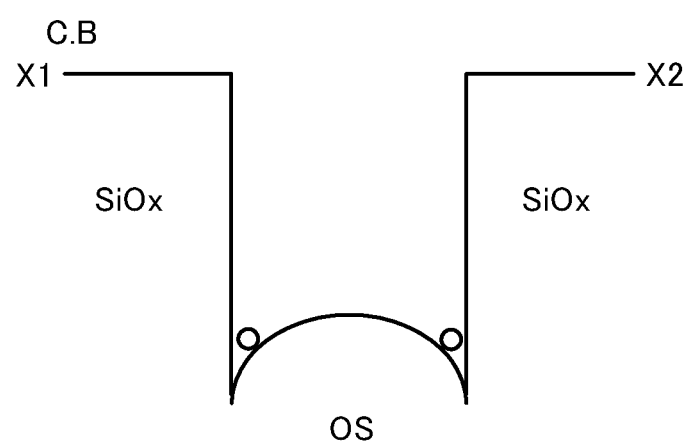

FIG. 6A illustrates a cross-sectional view of a transistor using a single oxide semiconductor layer, and FIG. 6B shows (a schematic view of) an energy band diagram of a cross section along X1-X2 in FIG. 6A.

The transistor illustrated in FIG. 6A includes an oxide semiconductor layer 411 provided over the substrate 400 with the insulating film 408 interposed therebetween, the source electrode layer 405a and the drain electrode layer 405b which are provided over the oxide semiconductor layer 411, the gate insulating film 409 provided to cover the oxide semiconductor layer 411, the source electrode layer 405a, and the drain electrode layer 405b, and the gate electrode layer 410 provide over the oxide semiconductor layer 411 with the gate insulating film 409 interposed therebetween.

In FIG. 6A, the oxide semiconductor layer 411 is an In—Ga—Zn-based oxide (also referred to as IGZO) layer and the insulating film 408 and the gate insulating film 409 are each a silicon oxynitride film.

Figure 7A:
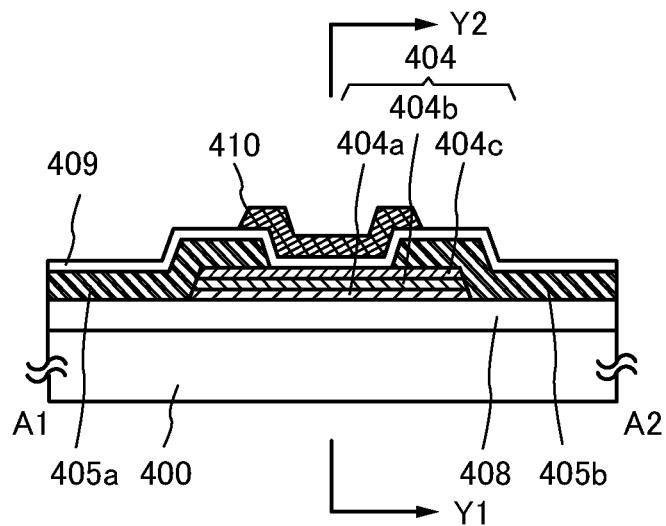
FIGS. 7A and 7B are a cross-sectional view and an energy band diagram of an oxide semiconductor stacked film having a three-layer structure.
Figure 7B:
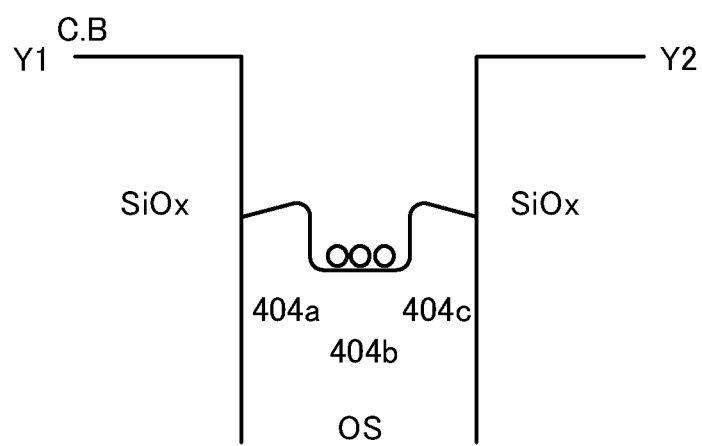

FIG. 7A illustrates a cross-sectional view of a transistor using stacked oxide semiconductor layers (IGZO layers), and FIG. 7B shows (a schematic view of) an energy band diagram of a cross section along Y1-Y2 in FIG. 7A.

The transistor illustrated in FIG. 7A includes the oxide semiconductor stacked film 404 provided over the substrate 400 with the insulating film 408 interposed therebetween, the source electrode layer 405a and the drain electrode layer 405b which are provided over the oxide semiconductor stacked film 404, the gate insulating film 409 provided to cover the oxide semiconductor stacked film 404, the source electrode layer 405a, and the drain electrode layer 405b, and the gate electrode layer 410 provided over the oxide semiconductor stacked film 404 with the gate insulating film 409 interposed therebetween.

In the oxide semiconductor stacked film 404 illustrated in FIG. 7A, the oxide semiconductor layers 404a and 404c are each an IGZO layer formed using a target having an atomic ratio of In:Ga:Zn=1:3:2 and the oxide semiconductor layer 404b is an IGZO layer formed using a target having an atomic ratio of In:Ga:Zn=1:1:1. In FIG. 7A, the insulating film 408 and the gate insulating film 409 are each a silicon oxynitride film.

As illustrated in FIG. 6B, in the case where the oxide semiconductor layer is a single layer, silicon in the silicon oxynitride film over or under the IGZO layer is mixed into the IGZO layer at about several nanometers from the interfaces in some cases. When the silicon enters the IGZO layer, impurity states are formed. The impurity states serve as donors to generate electrons; thus, an n-type semiconductor is formed.

Accordingly, the band of the oxide semiconductor is bended as illustrated in FIG. 6B. Further, when the silicon is mixed into the IGZO layer, the IGZO layer easily becomes amorphous. Further, there are interface scattering or scattering of impurities such as Si; thus, a reduction in electron mobility is concerned.

On the other hand, in the case where the oxide semiconductor layer has a three-layer structure as illustrated in FIG. 7B, even when silicon is mixed into the oxide semiconductor stacked film 404, the silicon is mixed into only the first oxide semiconductor layer 404a and the third oxide semiconductor layer 404c and is not easily mixed into the second oxide semiconductor layer 404b. The electron affinity of the first oxide semiconductor layer 404a and the third oxide semiconductor layer 404c each using the IGZO layer having an atomic ratio of In:Ga:Zn=1:3:2 is smaller than that of the second oxide semiconductor layer 404b using the IGZO layer having an atomic ratio of In:Ga:Zn=1:1:1. Thus, the conduction band of the oxide semiconductor stacked film 404 has a well structure as illustrated in FIG. 7B.

Silicon is mixed into the oxide semiconductor stacked film 404 in some cases; however, when the thicknesses of the first oxide semiconductor layer 404a and the third oxide semiconductor layer 404c are larger than several nanometers, silicon does not reach the second oxide semiconductor layer 404b; thus, the influence of mixing silicon is reduced.

In the transistor including the oxide semiconductor stacked film 404, the electron affinity of the second oxide semiconductor layer 404b is larger than that of the layers over and under the second oxide semiconductor layer 404b; thus, the second oxide semiconductor layer 404b mainly serves as an electron path. Further, since electrons flow through the second oxide semiconductor layer 404b, a trap due to the impurity states of the first oxide semiconductor layer 404a and the third oxide semiconductor layer 404c is not easily generated.

No or little silicon is mixed into the second oxide semiconductor layer 404b; thus, at least a region in the second oxide semiconductor layer 404b, where a channel is formed, can be made a CAAC-OS layer. Further, there are hardly interface scattering or scattering of impurities such as silicon; thus, electron mobility is improved.

The structures, methods, and the like described in this embodiment can be combined as appropriate with any of the other structures, methods, and the like described in the other embodiments.

Embodiment 3

In this embodiment, a method for manufacturing the transistor using the oxide semiconductor stacked film illustrated in FIGS. 4A to 4C is described with reference to FIGS. 8A to 8E.

Figure 8A:
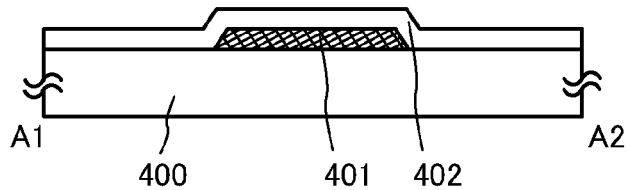
FIGS. 8A to 8E are cross-sectional views illustrating a method for manufacturing a semiconductor device.

First, the gate electrode layer 401 is formed over the substrate 400 (see FIG. 8A).

There is no particular limitation on a substrate that can be used as the substrate 400 having an insulating surface as long as it has heat resistance enough to withstand heat treatment performed later. A variety of glass substrates for electronics industry, such as a barium borosilicate glass substrate and an aluminoborosilicate glass substrate, can be used as the substrate 400. Note that as the substrate, a substrate having a thermal expansion coefficient of greater than or equal to $25 \times 10^{-7}/°$ C. and less than or equal to $50 \times 10^{-7}/°$ C. (preferably greater than or equal to $30 \times 10^{-7}/°$ C. and less than or equal to $40 \times 10^{-7}/°$ C.) and a strain point of higher than or equal to 650° C. and lower than or equal to 750° C. (preferably higher than or equal to 700° C. and lower than or equal to 740° C.) is preferably used.

In the case where a large-sized glass substrate with any of the 5th generation (1000 mm×1200 mm or 1300 mm×1700 mm), the 6th generation (1700 mm×1800 mm), the 7th generation (1870 mm×2200 mm), the 8th generation (2200 mm×2700 mm), the 9th generation (2400 mm×2800 mm), and the 10th generation (2880 mm×3130 mm) is used, minute processing might become difficult owing to shrinkage of the substrate caused by heat treatment or the like in the process for manufacturing a semiconductor device. Therefore, when such a large-sized glass substrate is used as the substrate, the one with a small shrinkage is preferably used. For example, as the substrate, a large-sized glass substrate whose shrinkage by heat treatment for one hour at preferably 450° C., more preferably 700° C. is less than or equal to 20 ppm, preferably less than or equal to 10 ppm, more preferably less than or equal to 5 ppm may be used.

Alternatively, a ceramic substrate, a quartz substrate, a sapphire substrate, or the like can be used as the substrate 400. Alternatively, a single crystal semiconductor substrate or a polycrystalline semiconductor substrate made of silicon or silicon carbide, a compound semiconductor substrate made of silicon germanium or the like, an SOI substrate, or the like can be used. Alternatively, any of these substrates over which a semiconductor element is provided may be used.

The semiconductor device may be manufactured using a flexible substrate as the substrate 400. To manufacture a flexible semiconductor device, the transistor 310 including the oxide semiconductor stacked film 404 may be directly formed over a flexible substrate; or alternatively, the transistor 310 including the oxide semiconductor stacked film 404 may be formed over a manufacturing substrate, and then the transistor may be separated from the manufacturing substrate and transferred to a flexible substrate. Note that, in order to separate the transistor from the manufacturing substrate and transfer it to the flexible substrate, a separation layer may be provided between the manufacturing substrate and the transistor 310 including the oxide semiconductor stacked film.

The gate electrode layer 401 can be formed with the use of a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. The gate electrode layer 401 can have a stacked structure of the above conductive material and the above metal material.

As the gate electrode layer 401, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used.

The gate insulating film 402 can be formed by a sputtering method or a CVD method using a deposition gas. As the CVD method, an LPCVD method, a plasma CVD method, or the like can be used, and as another method, a coating film or the like can also be used.

The gate insulating film 402 can be formed using a silicon oxide film, a gallium oxide film, an aluminum oxide film, a silicon nitride film, a silicon oxynitride film, an aluminum oxynitride film, or a silicon nitride oxide film.

When the gate insulating film 402 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. Further, the gate insulating film 402 has either a single-layer structure or a stacked-layer structure.

Note that a region which is included in the gate insulating film 402 and is in contact with a first oxide semiconductor layer 403a formed later (in this embodiment, the region is the gate insulating film) is preferably an oxide insulating film and preferably includes a region containing oxygen in excess of the stoichiometric composition (i.e., oxygen-excess region). In order to provide the oxygen-excess region in the gate insulating film 402, for example, the gate insulating film 402 may be formed in an oxygen atmosphere. Alternatively, oxygen may be introduced into the formed gate insulating film 402 to provide the oxygen-excess region. As a method for introducing oxygen, an ion implantation method, an ion doping method, a plasma immersion ion implantation method, plasma treatment, or the like may be employed.

By providing the oxygen-excess region in the gate insulating film 402, oxygen can be supplied by performing heat treatment after the formation of the oxide semiconductor stacked film. Thus, oxygen vacancies contained in the oxide semiconductor stacked film can be reduced.

In this embodiment, as the gate insulating film 402, a silicon nitride film and a silicon oxide film are formed.

Figure 8B:
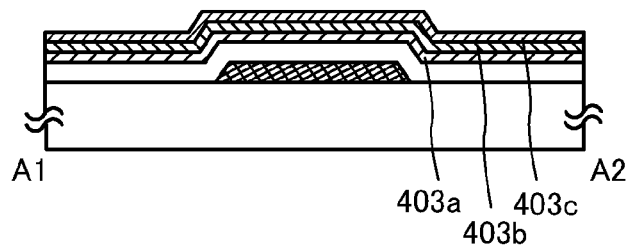

Next, the first oxide semiconductor layer 403a, a second oxide semiconductor layer 403b, and a third oxide semiconductor layer 403c to be included in the oxide semiconductor stacked film are sequentially formed over the gate insulating film 402 (see FIG. 8B).

As the first oxide semiconductor layer 403a, the second oxide semiconductor layer 403b, and the third oxide semiconductor layer 403c to be included in the oxide semiconductor stacked film, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by $In_2SnO_5(ZnO)_n$ (n>0, n is a natural number) may be used.

For example, an In—Ga—Zn-based oxide having an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), In:Ga:Zn=1:3:2 (=1/6:1/2:1/3), or an oxide having an atomic ratio close to the above atomic ratios can be used. Alternatively, an In—Sn—Zn-based oxide having an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide having an atomic ratio close to the above atomic ratios may be used.

However, an oxide semiconductor containing indium is not limited to the materials given above; a material with an appropriate composition may be used depending on required electrical characteristics of the transistor (e.g., field-effect mobility, threshold voltage, and variation). In order to obtain the required electrical characteristics of the transistor, it is preferable that the carrier concentration, the impurity concentration, the defect density, the atomic ratio between a metal element and oxygen, the interatomic distance, the density, and the like be set to appropriate values.

In this embodiment, the case where an IGZO layer having an atomic ratio of In:Ga:Zn=1:3:2 is used as the first oxide semiconductor layer 403a, an IGZO layer having an atomic ratio of In:Ga:Zn=1:1:1 is used as the second oxide semiconductor layer 403b, and an IGZO layer having an atomic ratio of In:Ga:Zn=1:3:2 is used as the third oxide semiconductor layer 403c is described.

The second oxide semiconductor layer 403b in the transistor 310 is formed of, for example, an oxide semiconductor layer including a crystal part. However, the formed second oxide semiconductor layer 403b does not necessarily include a crystal part, and in this case, the second oxide semiconductor layer 403b including a crystal part may be obtained by performing heat treatment on the amorphous oxide semiconductor in any of the steps after the formation of the second oxide semiconductor layer 403b. The heat treatment for crystallizing the amorphous oxide semiconductor is performed at a temperature higher than or equal to 250° C. and lower than or equal to 700° C., preferably higher than or equal to 400° C., more preferably higher than or equal to 550° C. The heat treatment can also serve as another heat treatment in the manufacturing process. A laser irradiation apparatus may be used for the heat treatment for crystallization.

The oxide semiconductor layers each can be formed by a sputtering method, a molecular beam epitaxy (MBE) method, a CVD method, a pulse laser deposition method, an atomic layer deposition (ALD) method, or the like as appropriate.

In the formation of the oxide semiconductor layers 403a to 403c, the concentration of hydrogen to be contained is preferably reduced as much as possible. In order to reduce the hydrogen concentration, for example, in the case where a sputtering method is used for the deposition, a high-purity rare gas (typically, argon) from which impurities such as hydrogen, water, a hydroxyl group, or a hydride have been removed; oxygen; or a mixed gas of oxygen and the rare gas is used as appropriate as an atmosphere gas supplied to a treatment chamber of a sputtering apparatus.

The oxide semiconductor layer is formed in such a manner that a sputtering gas from which hydrogen and moisture are removed is introduced into a treatment chamber while moisture remaining in the treatment chamber is removed, whereby the concentration of hydrogen in the deposited oxide semiconductor layer can be reduced. In order to remove the residual moisture in the treatment chamber, an entrapment vacuum pump, for example, a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like; thus, the impurity concentration in the oxide semiconductor film formed in the treatment chamber which is evacuated with the cryopump can be reduced.

Further, in the case where the oxide semiconductor layers 403a to 403c are formed by a sputtering method, the relative density (the fill rate) of a metal oxide target which is used for forming the oxide semiconductor films is greater than or equal to 90% and less than or equal to 100%, preferably greater than or equal to 95% and less than or equal to 99.9%. With the use of the metal oxide target having high relative density, a dense oxide film can be formed.

Note that formation of the oxide semiconductor layer while the substrate 400 is kept at high temperatures is also effective in reducing the impurity concentration in the oxide semiconductor layer. The heating temperature of the substrate 400 may be higher than or equal to 150° C. and lower than or equal to 450° C.; the substrate temperature is preferably higher than or equal to 200° C. and lower than or equal to 350° C. An oxide semiconductor layer is formed while the substrate is heated at a high temperature, whereby the oxide semiconductor film can have a crystalline portion.

The conditions described below are preferably employed for the formation of the CAAC-OS layer.

By reducing the amount of impurities entering the CAAC-OS layer during the deposition, the crystal state of the oxide semiconductor layer can be prevented from being broken by the impurities. For example, the concentration of impurities (e.g., hydrogen, water, carbon dioxide, or nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 700° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

Note that the oxide semiconductor layers 403a to 403c are preferably formed in succession without exposure to the air. By forming the oxide semiconductor layers in succession without exposure to the air, attachment of hydrogen or a hydrogen compound (e.g., adsorption water) onto surfaces of the oxide semiconductor layers can be prevented. Thus, the entry of impurities can be prevented. In a similar manner, the gate insulating film 402 and the oxide semiconductor layer 403a are preferably formed in succession without exposure to the air.

Further, heat treatment is preferably performed on the oxide semiconductor layers 403a to 403c in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed by the heat treatment.

Note that the heat treatment for the dehydration or dehydrogenation may be performed at any timing in the manufacturing process of the transistor as long as it is performed after the formation of the oxide semiconductor layer. For example, the heat treatment may be performed after the oxide semiconductor layer is processed into an island shape. The heat treatment for dehydration or dehydrogenation may be performed plural times, and may also serve as another heat treatment. A laser irradiation apparatus may be used for the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer is heated in the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is maintained or slow cooling is performed to lower the temperature from the heating temperature. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (that is, the impurity concentration in the oxygen gas or the dinitrogen monoxide gas is preferably 1 ppm or lower, further preferably 0.1 ppm or lower). The oxygen gas or the dinitrogen monoxide gas acts to supply oxygen which is a main component of the oxide semiconductor and that has been reduced by the step of removing an impurity for the dehydration or dehydrogenation, so that the oxide semiconductor layer can have high purity and be an i-type (intrinsic) oxide semiconductor layer.

Since there is a possibility that oxygen is also released and reduced by dehydration or dehydrogenation treatment, oxygen (including at least one of an oxygen radical, an oxygen atom, and an oxygen ion) may be introduced into the oxide semiconductor layers which have been subjected to the dehydration or dehydrogenation treatment to supply oxygen to the layers.

Oxygen is added to the dehydrated or dehydrogenated oxide semiconductor layer to be supplied thereto, so that the oxide semiconductor layer can be highly purified and be i-type (intrinsic). Variations in electrical characteristics of a transistor having the highly-purified and i-type (intrinsic) oxide semiconductor are suppressed, and the transistor is electrically stable.

In the step of introduction of oxygen, oxygen may be directly introduced to the oxide semiconductor stacked film (or the oxide semiconductor layer) or oxygen may be introduced to the oxide semiconductor stacked film through another insulating layer to be formed later. As a method for introducing oxygen (including at least one of an oxygen radical, an oxygen atom, and an oxygen ion), an ion implantation method, an ion doping method, a plasma immersion ion implantation method, plasma treatment, or the like can be used. A gas containing oxygen can be used for oxygen introduction treatment. As the gas containing oxygen, oxygen, dinitrogen monoxide, nitrogen dioxide, carbon dioxide, carbon monoxide, and the like can be used. Further, a rare gas may be contained in the gas containing oxygen in the oxygen introduction treatment.

For example, in the case where an oxygen ion is implanted by an ion implantation method, the dose can be greater than or equal to $1 \times 10^{13}$ ions/cm$^2$ and less than or equal to $5 \times 10^{16}$ ions/cm$^2$.

The timing of supply of oxygen to the oxide semiconductor stacked film is not particularly limited to the above as long as it is after the formation of the oxide semiconductor stacked film. The step of introducing oxygen may be performed plural times.

Figure 8C:
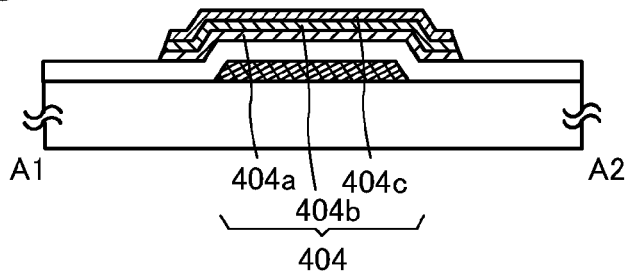

Next, the oxide semiconductor layers 403a to 403c are processed by etching treatment using a photolithography method into the island-shaped first oxide semiconductor layer 404a, second oxide semiconductor layer 404b, and third oxide semiconductor layer 404c, respectively, whereby the oxide semiconductor stacked film 404 is formed (see FIG. 8C).

Note that in this embodiment, the first oxide semiconductor layer 404a, the second oxide semiconductor layer 404b, and the third oxide semiconductor layer 404c are processed into island shapes by one etching treatment; thus, the ends of the oxide semiconductor layers included in the oxide semiconductor stacked film 404 are aligned with each other. Note that in this specification, "aligning with" includes "substantially aligning with". For example, an end of a layer A and an end of a layer B, which are included in a stacked-layer structure etched using the same mask, are considered to be aligned with each other.

Figure 8D:
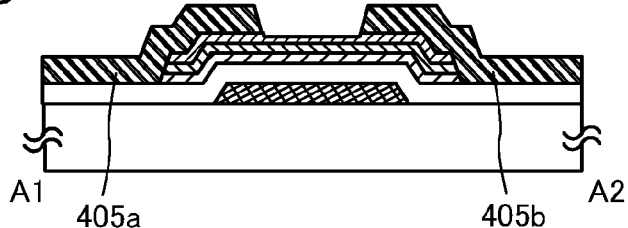

Then, a conductive film is formed over the oxide semiconductor stacked film 404 and processed to form the source electrode layer 405a and the drain electrode layer 405b (including a wiring formed using the same layer) (see FIG. 8D).

The source electrode layer 405a and the drain electrode layer 405b can be formed using, for example, a metal film containing an element selected from aluminum, chromium, copper, tantalum, titanium, molybdenum, and tungsten, a metal nitride film containing any of these elements as its component (a titanium nitride film, a molybdenum nitride film, or a tungsten nitride film), or the like. Alternatively, a film of a high-melting-point metal such as titanium, molybdenum, or tungsten or a metal nitride film of any of these elements (a titanium nitride film, a molybdenum nitride film, or a tungsten nitride film) may be stacked on one of or both a bottom side and a top side of a metal film of aluminum, copper, or the like. Further alternatively, the conductive film used as the source electrode layer 405a and the drain electrode layer 405b may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials containing silicon oxide can be used.

The insulating film 406 can be formed by a plasma CVD method, a sputtering method, an evaporation method, or the like.

The insulating film 406 can be a single layer or a stacked layer of a silicon oxide film, a silicon oxynitride film, an aluminum oxide film, an aluminum oxynitride film, an inorganic insulating film such as a gallium oxide film, a hafnium oxide film, a magnesium oxide film, a zirconium oxide film, a lanthanum oxide film, a barium oxide film, a silicon nitride film, a silicon nitride oxide film, an aluminum nitride film, or an aluminum nitride oxide film, or the like.

In this embodiment, as the insulating film 406, a silicon oxide film is formed.

Here, in order to form an oxygen-excess region in the insulating film 406, the step of adding oxygen to the insulating film 406 may be performed. The step of adding oxygen to the insulating film 406 can be performed in a manner similar to the step of adding oxygen to the gate insulating film 402.

In addition, a planarization insulating film may be formed over the transistor in order that surface unevenness due to the transistor is reduced. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Figure 8E:
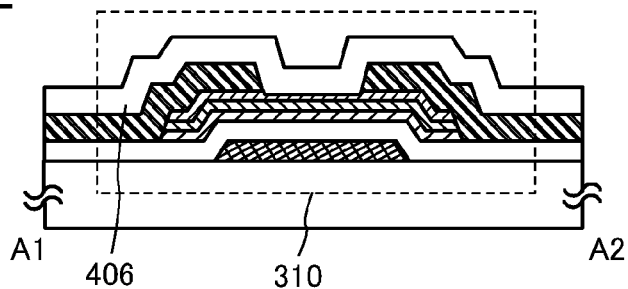

Through the above steps, a semiconductor device of the present invention can be manufactured (see FIG. 8E).

An oxide insulating film is used as an insulating film in contact with the oxide semiconductor stacked film 404 or an oxygen-excess region is formed in an insulating film, whereby excess oxygen contained in the insulating film can be supplied to the oxide semiconductor stacked film by heat treatment or the like. Thus, oxygen vacancies contained in the oxide semiconductor stacked film can be reduced.

As illustrated in FIG. 8E, three oxide semiconductor layers are provided, and the conductivity of the oxide semiconductor layer 404b is higher than that of the oxide semiconductor layer 404a and the oxide semiconductor layer 404c. With the above structure, even when voltage is applied from the insulating film 406 side, carriers do not flow in an interface between the oxide semiconductor layer 404c and the insulating film 406 but flow in an interface between the oxide semiconductor layer 404b and the oxide semiconductor layer 404c. Further, the oxide semiconductor layer 404b and the oxide semiconductor layer 404c which have different atomic ratios are formed using the same element. Thus, oxygen vacancies at the interface between the oxide semiconductor layer 404b and the oxide semiconductor layer 404c are reduced. As a result, even if carriers flow in the interface between the oxide semiconductor layer 404b and the oxide semiconductor layer 404c, the influence of the localized states due to the oxygen vacancies can be reduced.

FIGS. 9A to 9D illustrate examples of oxide semiconductor stacked films in bottom-gate transistors. These transistors have the same structure as the transistor 310 in FIGS. 4A to 4C except the oxide semiconductor stacked film.

Figure 9A:
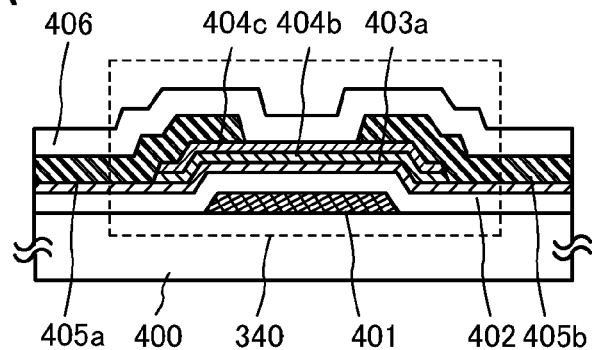
FIGS. 9A to 9D are cross-sectional views each illustrating a semiconductor device.

FIG. 9A illustrates a transistor 340 in which the second oxide semiconductor layer 404b and the third oxide semiconductor layer 404c are each processed into an island shape and the first oxide semiconductor layer 403a is not processed in the oxide semiconductor stacked film.

Figure 9B:
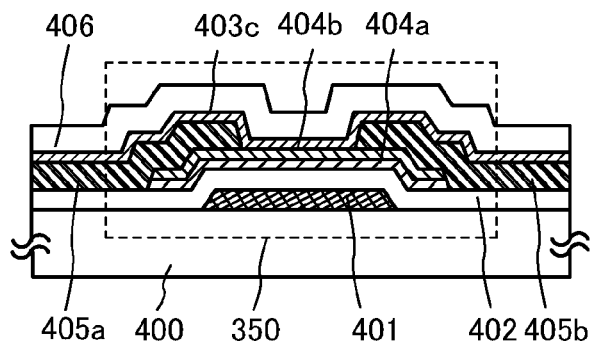

FIG. 9B illustrates a transistor 350 in which the first oxide semiconductor layer 404a and the second oxide semiconductor layer 404b are each processed into an island shape and the third oxide semiconductor layer 403c is not processed in the oxide semiconductor stacked film.

Figure 9C:
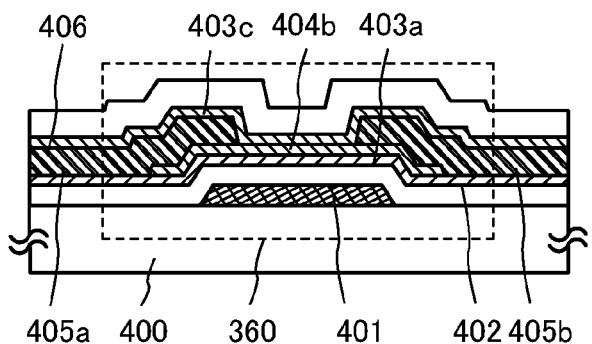

FIG. 9C illustrates a transistor 360 in which the second oxide semiconductor layer 404b is processed into an island shape and the first oxide semiconductor layer 403a and the third oxide semiconductor layer 403c are not processed in the oxide semiconductor stacked film.

Figure 9D:
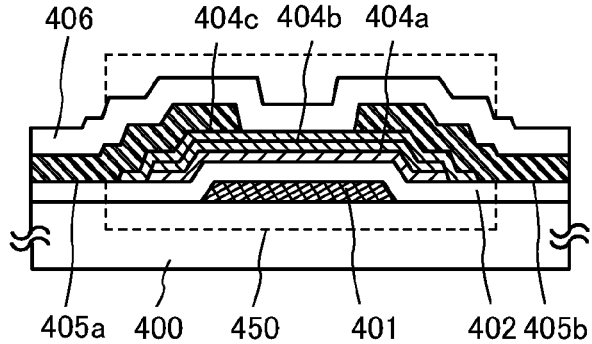

FIG. 9D illustrates a transistor 450 in which the first oxide semiconductor layer 404a and the second oxide semiconductor layer 404b are each processed into an island shape and the third oxide semiconductor layer 404c is provided to cover the side surfaces of the first oxide semiconductor layer 404a and the second oxide semiconductor layer 404b in the oxide semiconductor stacked film.

FIGS. 10A to 10D illustrate examples of oxide semiconductor stacked films in top-gate transistors. These transistors have the same structure as the transistor 320 in FIG. 5A except the oxide semiconductor stacked film.

Figure 10A:
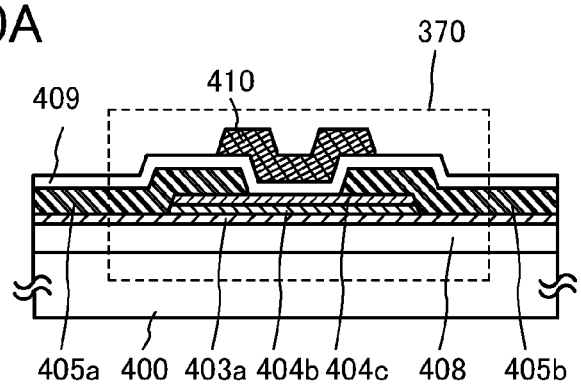
FIGS. 10A to 10D are cross-sectional views each illustrating a semiconductor device.

FIG. 10A illustrates a transistor 370 in which the second oxide semiconductor layer 404b and the third oxide semiconductor layer 404c are each processed into an island shape and the first oxide semiconductor layer 403a is not processed in the oxide semiconductor stacked film.

Figure 10B:
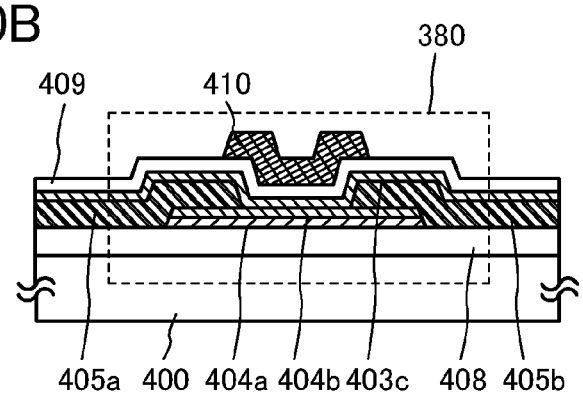

FIG. 10B illustrates a transistor 380 in which the first oxide semiconductor layer 404a and the second oxide semiconductor layer 404b are each processed into an island shape and the third oxide semiconductor layer 403c is not processed in the oxide semiconductor stacked film.

Figure 10C:
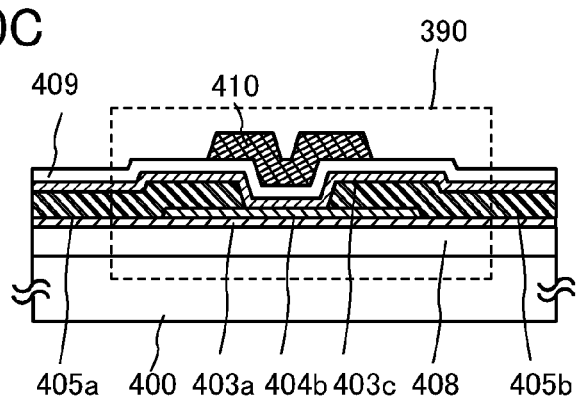

FIG. 10C illustrates a transistor 390 in which the second oxide semiconductor layer 404b is processed into an island shape and the first oxide semiconductor layer 403a and the third oxide semiconductor layer 403c are not processed in the oxide semiconductor stacked film.

Figure 10D:
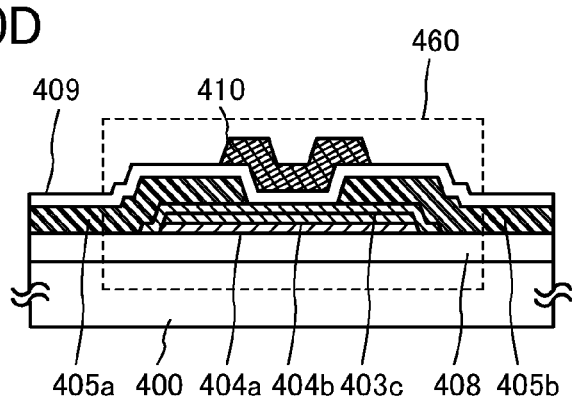

FIG. 10D illustrates a transistor 460 in which the first oxide semiconductor layer 404a and the second oxide semiconductor layer 404b are each processed into an island shape and the third oxide semiconductor layer 404c is provided to cover the side surfaces of the first oxide semiconductor layer 404a and the second oxide semiconductor layer 404b in the oxide semiconductor stacked film.

As the proportion of indium becomes higher in a metal oxide included in an oxide semiconductor, the conductivity of the metal oxide increases. For example, in the case where the content percentage of indium in the second oxide semiconductor layer 404b is higher than those in the first oxide semiconductor layer 404a and the third oxide semiconductor layer 404c, the conductivity $\sigma_2$ of the second oxide semiconductor layer 404b can be higher than the conductivity $\sigma_1$ of the first oxide semiconductor layer 404a and the conductivity $\sigma_3$ of the third oxide semiconductor layer 404c.

The conductivity $\sigma_2$ is preferably higher than the conductivity $\sigma_1$ and the conductivity $\sigma_3$ by $1\times10^3$ S/cm or more, more preferably by $1\times10^5$ S/cm or more.

For example, the conductivity of the oxide semiconductor layer having an atomic ratio of In:Ga:Zn=1:1:1 is $6.5\times10^{-5}$ S/cm to $4.5\times10^{-1}$ S/cm. Further, the conductivity of the oxide semiconductor layer having an atomic ratio of In:Ga:Zn=3:1:2 is 2 S/cm to 9.7 S/cm. Further, the conductivity of the oxide semiconductor layer having an atomic ratio of In:Ga:Zn=1:3:2 is $1\times10^{-7}$ S/cm (lower than the lower limit of measurement).

Therefore, even when the oxide semiconductor layer having an atomic ratio of In:Ga:Zn=1:3:2 is used as the first oxide semiconductor layer 403a or the third oxide semiconductor layer 403c which is not processed, the first or third oxide semiconductor layer does not become a leak path of carriers.

Further, an oxide semiconductor layer with high conductivity is used as the second oxide semiconductor layer 404b, whereby a channel of the transistor is formed in the second oxide semiconductor layer 404b. In the case of the bottom-gate transistors in FIGS. 9A to 9D, carriers flow in an interface between the second oxide semiconductor layer 404b and the first oxide semiconductor layer 404a. Further, in the case of the top-gate transistors in FIGS. 10A to 10D, carriers flow in an interface between the second oxide semiconductor layer 404b and the third oxide semiconductor layer 404c.

In any case, the influence of the localized states due to the oxygen vacancies can be reduced. Accordingly, a variation in electrical characteristics of a transistor can be suppressed and a transistor with high reliability can be obtained.

The structures, methods, and the like described in this embodiment can be combined as appropriate with any of the other structures, methods, and the like described in the other embodiments.

Embodiment 4

A semiconductor device disclosed in this specification can be applied to a variety of electronic appliances (including game machines). Examples of electronic appliances include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of these electronic appliances are illustrated in FIGS. 11A to 11C.

Figure 11A:
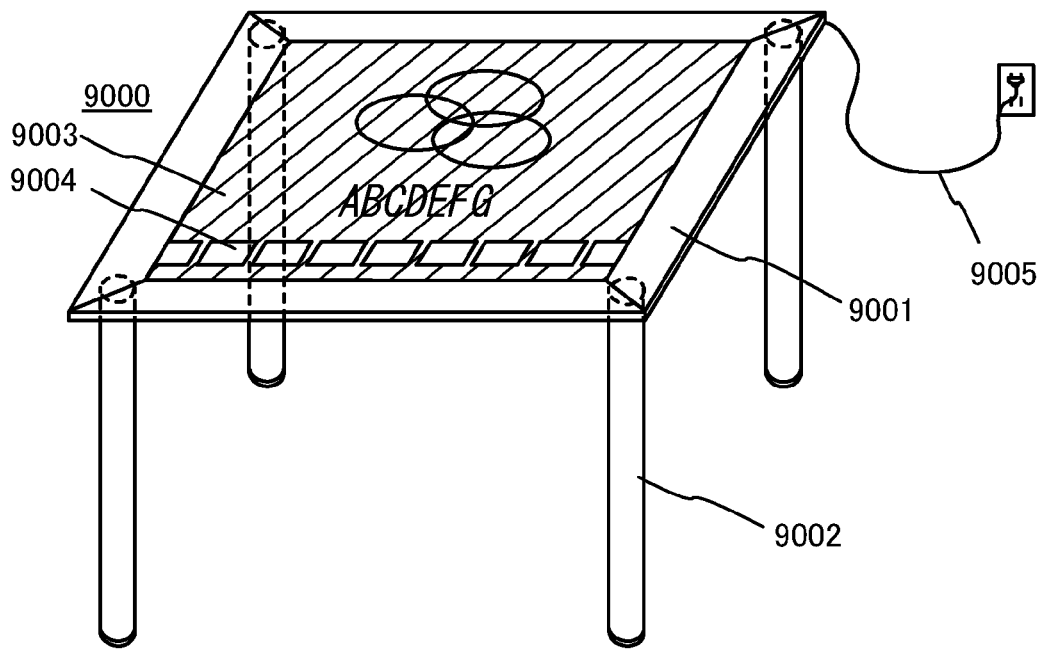
FIGS. 11A to 11C each illustrate an electronic appliance.
Figure 11B:
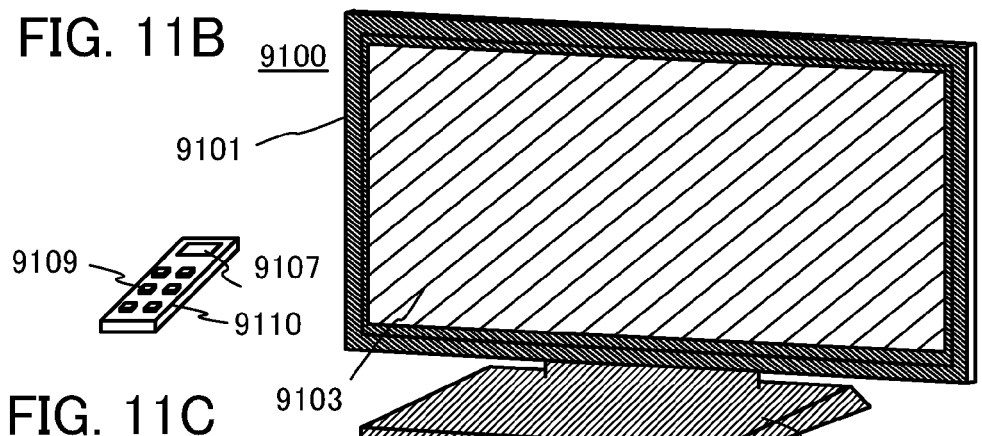
Figure 11C:
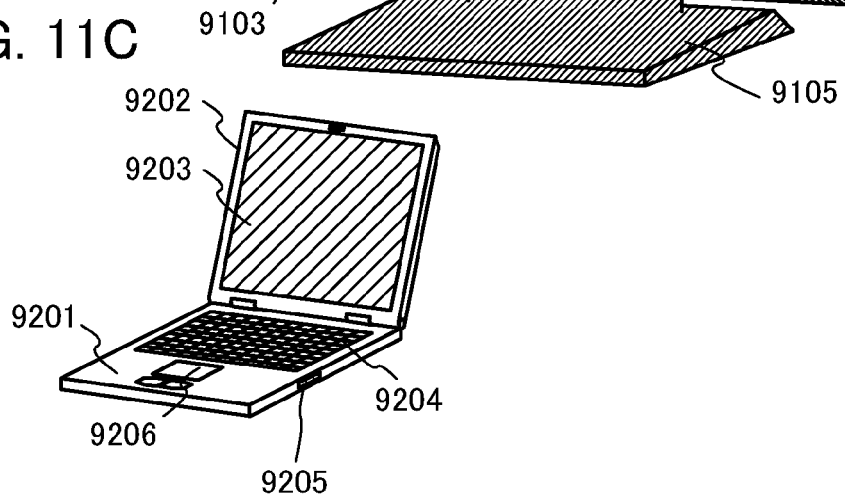

FIG. 11A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The semiconductor device described in any of the above embodiments can be used in the display portion 9003, so that the electronic appliance can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table may be made to communicate with home appliances or control the home appliances, the table 9000 may function as a control device which controls the home appliances by operation on the screen. For example, with use of the semiconductor device having an image sensor described in Embodiment 3, the display portion 9003 can function as a touch panel.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 11B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 11B is provided with a receiver, a modem, and the like. With the use of the receiver, the television set 9100 can receive general TV broadcasts. Moreover, when the television set 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107, so that the television set and the remote controller can have high reliability.

FIG. 11C illustrates a computer which includes a main body 9201, a housing 9202, a display portion 9203, a keyboard 9204, an external connection port 9205, a pointing device 9206, and the like.

The semiconductor device described in any of the above embodiments can be used in the display portion 9203, so that the computer can have high reliability.

Figure 12A:
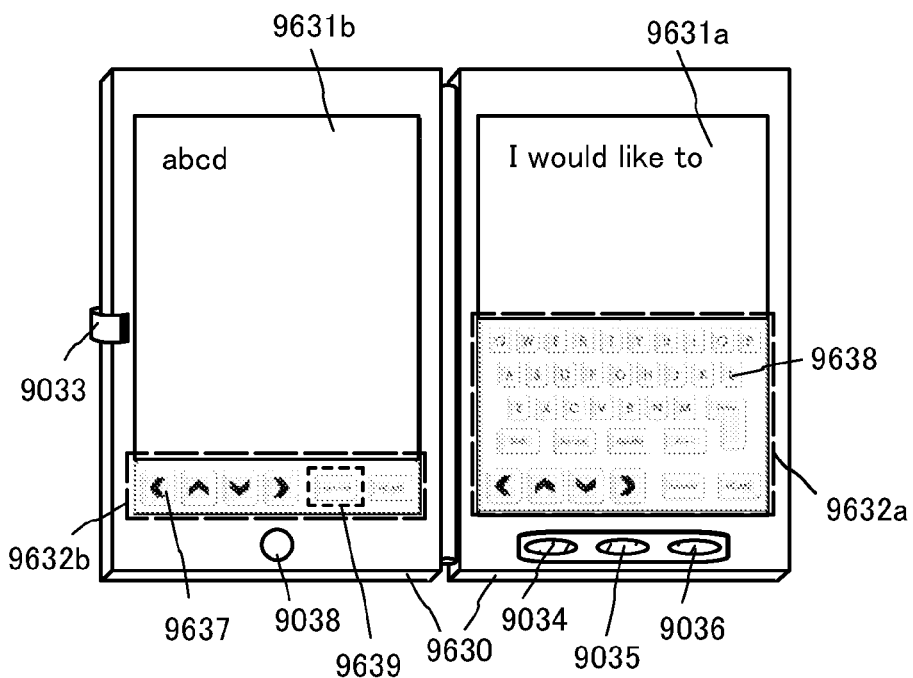
FIGS. 12A to 12C illustrate an electronic appliance.
Figure 12B:
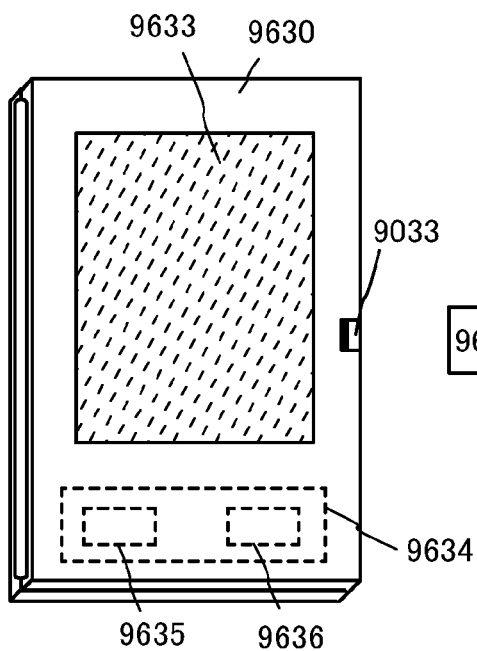

FIGS. 12A and 12B illustrate a tablet terminal that can be folded. In FIG. 12A, the tablet terminal is opened, and includes a housing 9630, a display portion 9631a, a display portion 9631b, a switch 9034 for switching display modes, a power switch 9035, a switch 9036 for switching to power-saving mode, a clip 9033, and an operation switch 9038.

The semiconductor device described in any of the above embodiments can be used in the display portion 9631a and the display portion 9631b, so that the tablet terminal can have high reliability.

Part of the display portion 9631a can be a touch panel region 9632a, and data can be input by touching operation keys 9638 that are displayed. Note that FIG. 9A shows, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 12A, an embodiment of the present invention is not limited to this example. The display portion 9631a and the display portion 9631b may have different areas or different display quality. For example, one of them may be a display panel that can display higher-definition images than the other.

FIG. 12B illustrates the tablet terminal folded, which includes the housing 9630, a solar battery 9633, and a charge and discharge control circuit 9634. Note that FIG. 12B shows an example in which the charge and discharge control circuit 9634 includes the battery 9635 and the DCDC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630 and the battery 9635 can be charged efficiently. When a lithium ion battery is used as the battery 9635, there is an advantage of downsizing or the like.

Figure 12C:
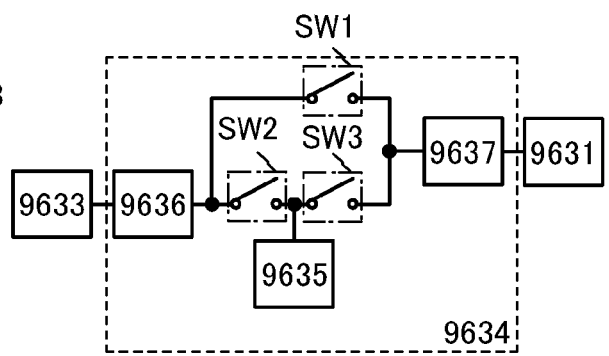

The structure and operation of the charge and discharge control circuit 9634 illustrated in FIG. 12B are described with reference to a block diagram of FIG. 12C. FIG. 12C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 12B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

Example 1

In this example, the results of CPM measurement performed on a first oxide semiconductor layer, a second oxide semiconductor layer, and a third oxide semiconductor layer which are sequentially stacked are described.

A sample A manufactured in this example is described with reference to FIG. 13A.

First, as the first oxide semiconductor layer, a 30-nm-thick IGZO layer having an atomic ratio of In:Ga:Zn=1:3:2 was formed over a glass substrate 700. The IGZO layer having an atomic ratio of In:Ga:Zn=1:3:2 was formed under the following conditions: a sputtering target of In:Ga:Zn=1:3:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:3:2 was formed at a substrate temperature of 200° C.

Then, as the second oxide semiconductor layer, a 100-nm-thick IGZO layer having an atomic ratio of In:Ga:Zn=1:1:1 was formed. The IGZO layer having an atomic ratio of In:Ga:Zn=1:1:1 was formed under the following conditions: a sputtering target of In:Ga:Zn=1:1:1 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:1:1 was formed at a substrate temperature of 200° C.

Next, the first oxide semiconductor layer and the second oxide semiconductor layer were etched to form an island-shaped first oxide semiconductor layer 701a and an island-shaped second oxide semiconductor layer 701b.

Then, heat treatment was performed. The heat treatment was performed at 450° C. under a nitrogen atmosphere for one hour, and then in dry air (under a dry atmosphere) for one hour.

Next, a 100-nm-thick tungsten film was formed over the island-shaped first oxide semiconductor layer 701a and the island-shaped second oxide semiconductor layer 701b. The tungsten film was formed under the following conditions: a sputtering target of tungsten was used; argon with a flow rate of 80 sccm was supplied as a sputtering gas into a treatment chamber of a sputtering apparatus; the pressure in the treatment chamber was controlled to be 0.8 Pa; and a DC power of 1 kW was supplied. Note that the tungsten film was formed at 230° C. Then, the tungsten film was selectively etched to form electrode layers 705a and 705b.

Next, as the third oxide semiconductor layer 701c, a 30-nm-thick IGZO layer having an atomic ratio of In:Ga:Zn=1:3:2 was formed over the second oxide semiconductor layer 701b and the electrode layers 705a and 705b. The IGZO layer having an atomic ratio of In:Ga:Zn=1:3:2 was formed under the following conditions: a sputtering target of In:Ga:Zn=1:3:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:3:2 was formed at a substrate temperature of 200° C.

Next, as an insulating film 706, a 300-nm-thick silicon oxide film was formed over the third oxide semiconductor layer 701c. The silicon oxide film was formed under the following conditions: a sputtering target of silicon oxide was used; oxygen with a flow rate of 50 sccm was supplied as a sputtering gas into a treatment chamber of a sputtering apparatus; the pressure in the treatment chamber was controlled to be 0.4 Pa; and a DC power of 1.5 kW was supplied. Note that the silicon oxide film was formed at a substrate temperature of 100° C.

After the formation of the silicon oxide film, heat treatment was performed. The heat treatment was performed at 300° C. in dry air (under a dry atmosphere) for one hour.

Figure 13A:
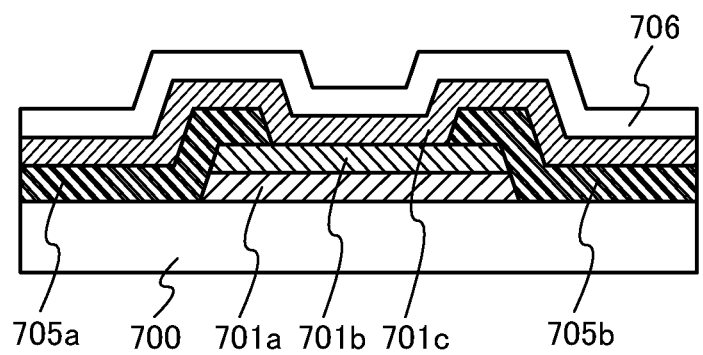
FIGS. 13A and 13B are cross-sectional views illustrating a sample A and a sample B.

Through the above process, the sample A illustrated in FIG. 13A was manufactured.

Next, a sample B is described with reference to FIG. 13B.

First, as the first oxide semiconductor layer, a 30-nm-thick IGZO layer having an atomic ratio of In:Ga:Zn=1:3:2 was formed over a glass substrate 700 in a manner similar to the sample A. The IGZO layer having an atomic ratio of In:Ga:Zn=1:3:2 was formed under the following conditions: a sputtering target of In:Ga:Zn=1:3:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:3:2 was formed at a substrate temperature of 200° C.

Then, as the second oxide semiconductor layers 701b (701b1, 701b2), a 50-nm-thick IGZO layer having an atomic ratio of In:Ga:Zn=3:1:2 and a 50-nm-thick IGZO layer having an atomic ratio of In:Ga:Zn=1:1:1 were formed. The IGZO layer having an atomic ratio of In:Ga:Zn=3:1:2 was formed under the following conditions: a sputtering target of In:Ga:Zn=3:1:2 (atomic ratio) was used; oxygen with a flow rate of 45 sccm was supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=3:1:2 was formed at a substrate temperature of 200° C. The IGZO layer having an atomic ratio of In:Ga:Zn=1:1:1 was formed under the following conditions: a sputtering target of In:Ga:Zn=1:1:1 (atomic ratio) was used; oxygen with a flow rate of 45 sccm was supplied as a sputtering gas into a treatment chamber of a sputtering apparatus; the pressure in the treatment chamber was controlled to be 0.4 Pa; and a DC power of 0.5 kW was supplied.

Next, the first oxide semiconductor layer and the second oxide semiconductor layer were etched to form an island-shaped first oxide semiconductor layer 701a and island-shaped second oxide semiconductor layers 701b (701b1, 701b2).

Then, heat treatment was performed. The heat treatment was performed at 450° C. under a nitrogen atmosphere for one hour, and then in dry air (under a dry atmosphere) for one hour.

Next, a 100-nm-thick tungsten film was formed over the island-shaped first oxide semiconductor layer 701a and the island-shaped second oxide semiconductor layers 701b (701b1, 701b2). The tungsten film was formed under the following conditions: a sputtering target of tungsten was used; argon with a flow rate of 80 sccm was supplied as a sputtering gas into a treatment chamber of a sputtering apparatus; the pressure in the treatment chamber was controlled to be 0.8 Pa; and a DC power of 1 kW was supplied. Note that the tungsten film was formed at 230° C. Then, the tungsten film was selectively etched to form electrode layers 705a and 705b.

Next, as the third oxide semiconductor layer 701c, a 30-nm-thick IGZO layer having an atomic ratio of In:Ga:Zn=1:3:2 was formed over the second oxide semiconductor layers 701b (701b1, 701b2) and the electrode layers 705a and 705b. The IGZO layer having an atomic ratio of In:Ga:Zn=1:3:2 was formed under the following conditions: a sputtering target of In:Ga:Zn=1:3:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:3:2 was formed at a substrate temperature of 200° C.

Next, as an insulating film 706, a 300-nm-thick silicon oxide film was formed over the third oxide semiconductor layer 701c. The silicon oxide film was formed under the following conditions: a sputtering target of silicon oxide was used; oxygen with a flow rate of 50 sccm was supplied as a sputtering gas into a treatment chamber of a sputtering apparatus; the pressure in the treatment chamber was controlled to be 0.4 Pa; and a DC power of 1.5 kW was supplied. Note that the silicon oxide film was formed at a substrate temperature of 100° C.

After the formation of the silicon oxide film, heat treatment was performed. The heat treatment was performed at 300° C. in dry air (under a dry atmosphere) for one hour.

Figure 13B:
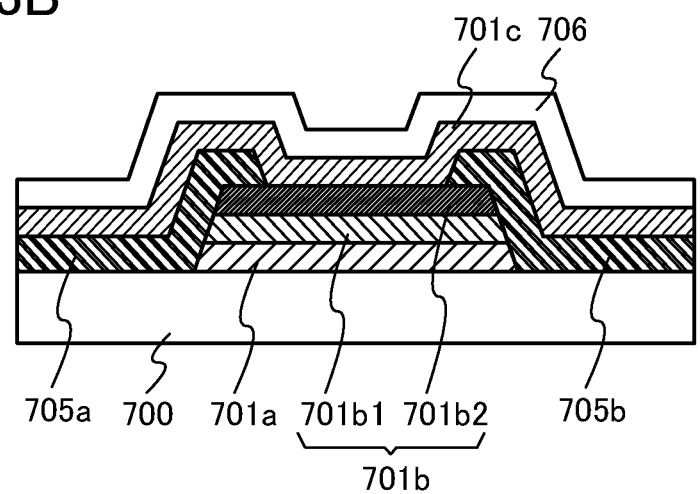

Through the above process, the sample B illustrated in FIG. 13B was manufactured.

Figure 14A:
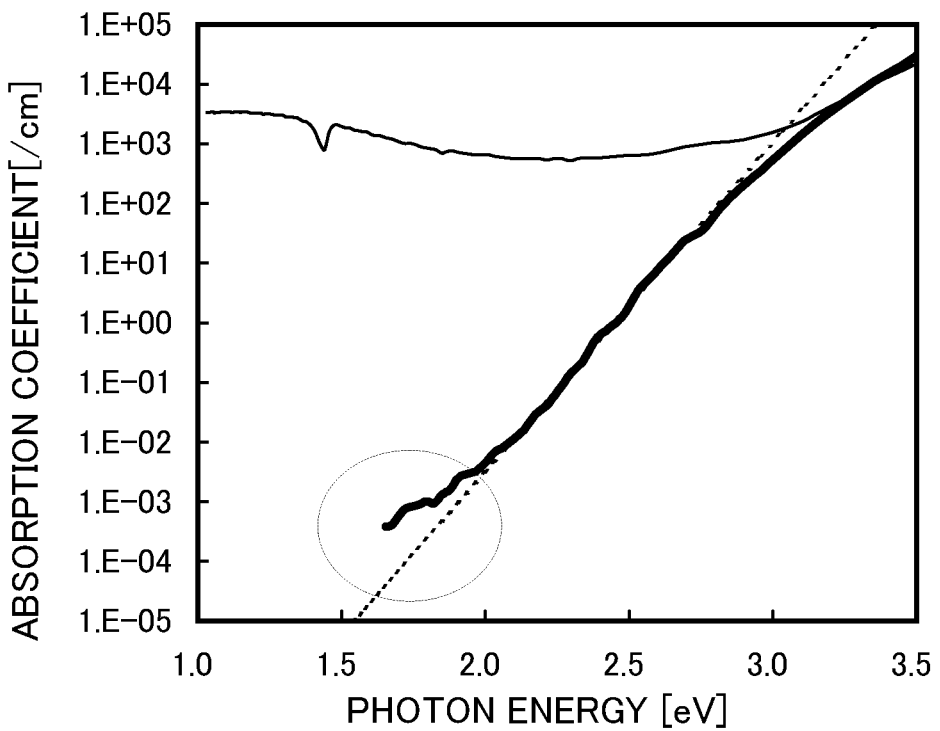
FIGS. 14A and 14B show results of CPM measurement of a sample A.
Figure 14B:
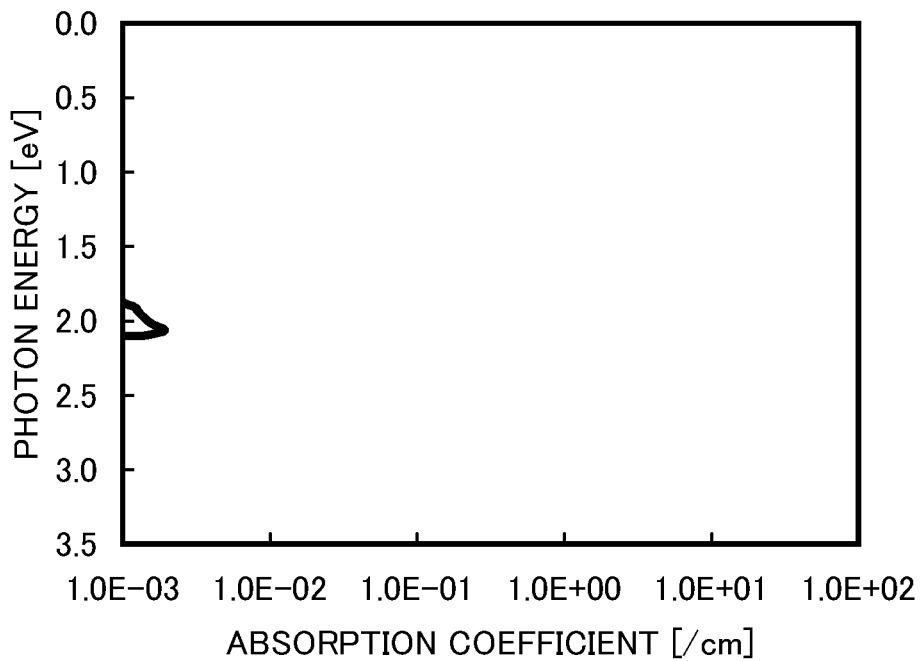
Figure 15A:
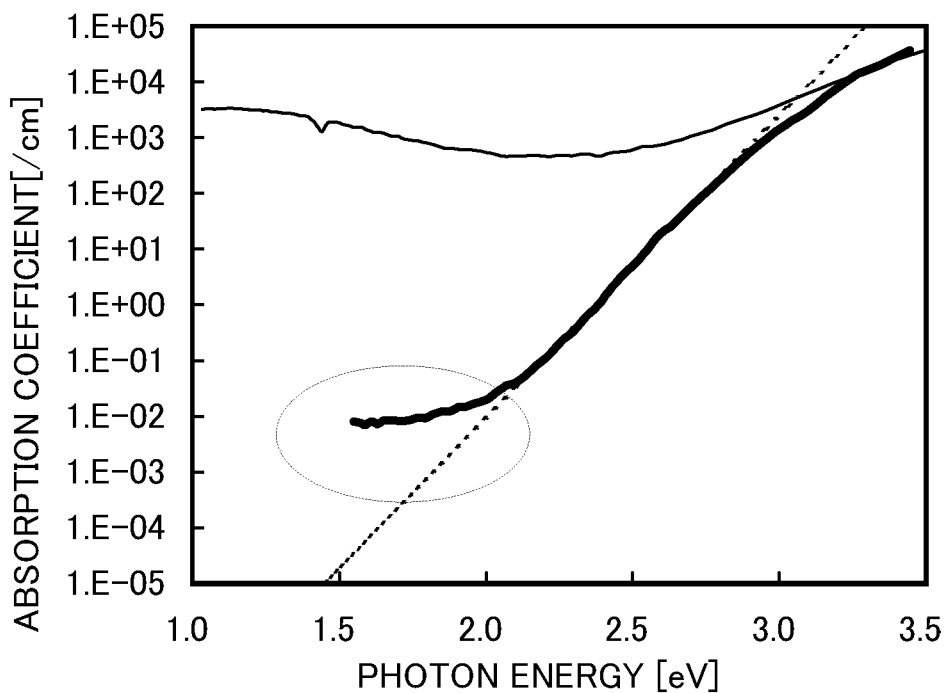
FIGS. 15A and 15B show results of CPM measurement of a sample B.
Figure 15B:
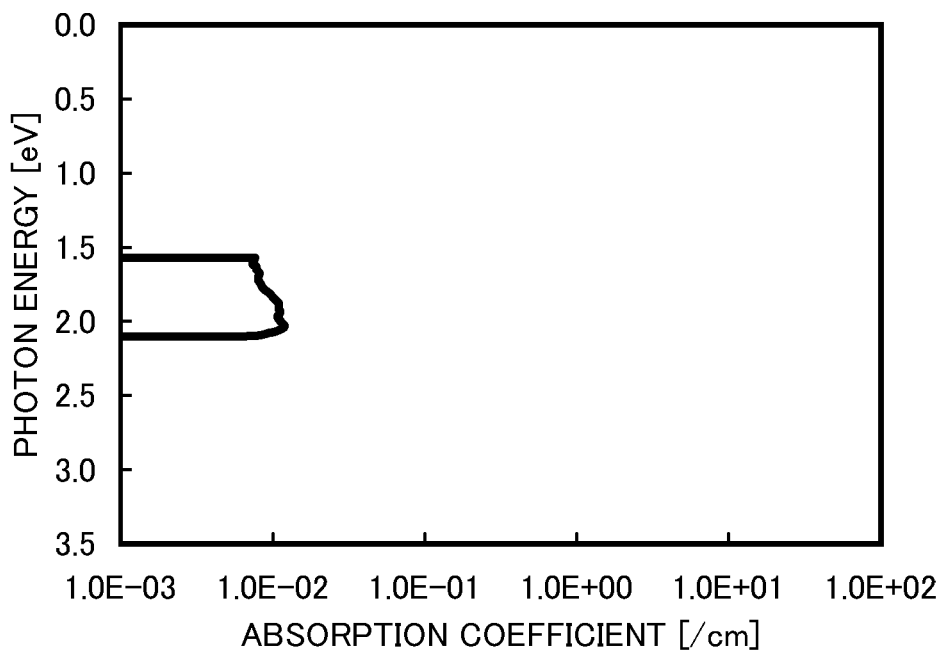

FIGS. 14A and 14B and FIGS. 15A and 15B show the results of CPM measurement performed on the sample A and the sample B. In FIGS. 14A and 15A, a thick line represents a curve of the absorption coefficient of each sample, a thin line represents the absorption coefficient optically measured, and a thin dotted line represents a tangent. FIG. 14A shows the curve of the absorption coefficient of the sample A and FIG. 14B shows the absorption coefficient obtained by removing the absorption coefficient due to the band tail from the curve of the absorption coefficient, that is, the absorption coefficient due to defects. FIG. 15A shows the curve of the absorption coefficient of the sample B and FIG. 15B shows the absorption coefficient due to defects.

In FIGS. 14A and 15A, the horizontal axis indicates the photon energy, and the vertical axis indicates the absorption coefficient. In FIGS. 14B and 15B, the horizontal axis indicates the absorption coefficient, and the vertical axis indicates the photon energy. On the vertical axes in FIGS. 14B and 15B, the bottom of the conduction band of the oxide semiconductor layer is set to 0 eV, and the top of the valence band is set to 3.15 eV. In FIG. 14B, the curve indicated by a solid line corresponds to the localized states of the sample A, and absorption due to the localized states is seen in an energy range of 1.5 eV to 2.3 eV. When the values at each energy level are integrated, it is found that the absorption coefficient due to the localized states of the sample A is $2.02 \times 10^{-4}$/cm. Further, in FIG. 15B, the curve indicated by a solid line corresponds to the localized states of the sample B, and absorption due to the localized states is seen in an energy range of 1.5 eV to 2.3 eV. When the values at each energy level are integrated, it is found that the absorption coefficient due to the localized states of the sample B is $2.84 \times 10^{-3}$/cm.

Consequently, it is found that the second oxide semiconductor layer 701b in which the proportion of indium is high is sandwiched between the first oxide semiconductor layer 701a and the third oxide semiconductor layer 701c, whereby the influence of the oxygen vacancies can be reduced. As a result, it is thought that the absorption coefficient due to the localized states measured by the CPM can be the above value.

Example 2

In this example, the results of evaluating the reliability of the transistor including the oxide semiconductor stacked film of one embodiment of the present invention.

A sample C and a sample D each including the transistor including the oxide semiconductor stacked film of one embodiment of the present invention are described with reference to FIGS. 16A to 16D.

First, a manufacturing process of the sample C including a transistor is described. As a substrate 800, a silicon substrate was used, and as a base film 808, a 100-nm-thick silicon oxide film and a 300-nm-thick silicon oxynitride film were formed over the substrate 800. The silicon oxide film was formed by performing thermal oxidation treatment at 950° C. in an oxidizing atmosphere containing chlorine. Further, the silicon oxynitride film was formed by a CVD method.

Next, by performing CMP treatment on a surface of the base film 808, planarization treatment was performed on the surface of the base film 808.

After the planarization treatment, heat treatment was performed. The heat treatment was performed at 450° C. in a vacuum for one hour. After that, oxygen ions were added to the base film 808 by an ion implantation method. Note that the conditions of the oxygen ion implantation were as follows: an acceleration voltage of 60 kV and a dosage of $2.0 \times 10^{16}$ ions/cm$^2$.

Next, as the first oxide semiconductor layer 803a, a 5-nm-thick IGZO layer having an atomic ratio of In:Ga:Zn=1:3:2 was formed. The IGZO layer having an atomic ratio of In:Ga:Zn=1:3:2 was formed under the following conditions: a sputtering target of In:Ga:Zn=1:3:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:3:2 was formed at a substrate temperature of 200° C.

Then, as the second oxide semiconductor layer 803b, a 5-nm-thick IGZO layer having an atomic ratio of In:Ga:Zn=3:1:2 was formed. The IGZO layer having an atomic ratio of In:Ga:Zn=3:1:2 was formed under the following conditions: a sputtering target of In:Ga:Zn=3:1:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=3:1:2 was formed at a substrate temperature of 200° C.

Then, as the third oxide semiconductor layer 803c, a 5-nm-thick IGZO layer having an atomic ratio of In:Ga:Zn=1:1:1 was formed. The IGZO layer having an atomic ratio of In:Ga:Zn=1:1:1 was formed under the following conditions: a sputtering target of In:Ga:Zn=1:1:1 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:1:1 was formed at a substrate temperature of 300° C.

Figure 16A:
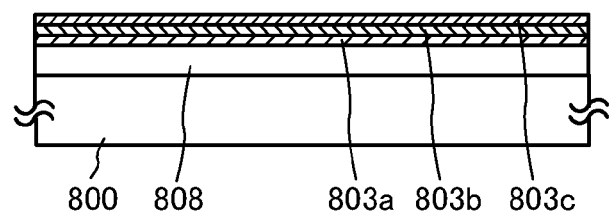
FIGS. 16A to 16D illustrate a method for manufacturing a transistor.

Note that the first oxide semiconductor layer 803a, the second oxide semiconductor layer 803b, and the third oxide semiconductor layer 803c were successively formed without exposure to the air. The above steps are illustrated in FIG. 16A.

Then, heat treatment was performed after the formation of the third oxide semiconductor layer 803c. The heat treatment was performed at 450° C. under a nitrogen atmosphere for one hour, and then under an oxygen atmosphere for one hour.

Figure 16B:
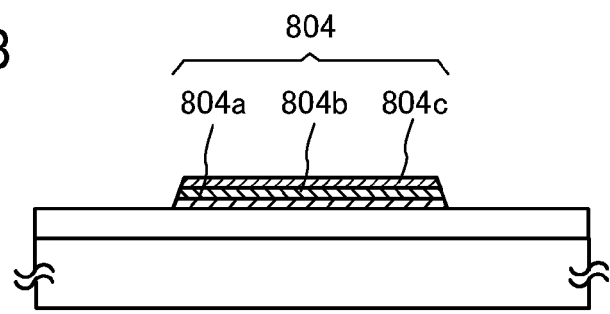
Figure 16C:
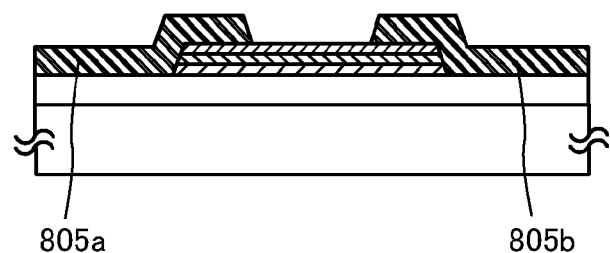
Figure 16D:
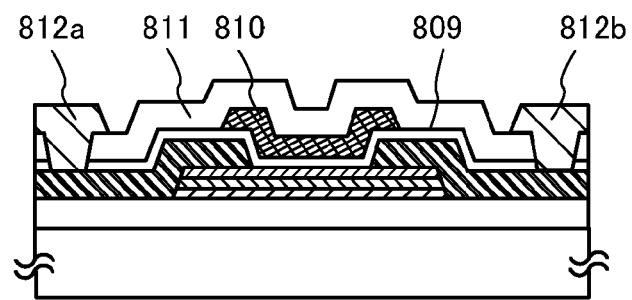

Next, the first oxide semiconductor layer 803a, the second oxide semiconductor layer 803b, and the third oxide semiconductor layer 803c were processed into the first oxide semiconductor layer 804a, the second oxide semiconductor layer 804b, and the third oxide semiconductor layer 804c each having an island shape by etching treatment using a photolithography process, so that the oxide semiconductor stacked film 804 was formed (see FIG. 16B).

Next, a 100-nm-thick tungsten film was formed over the oxide semiconductor stacked film 804. The tungsten film was formed under the following conditions: a sputtering target of tungsten was used; argon with a flow rate of 80 sccm was supplied as a sputtering gas into a treatment chamber of a sputtering apparatus; the pressure in the treatment chamber was controlled to be 0.8 Pa; and the DC power of 1 kW was supplied. Note that the tungsten film was formed at 230° C. Then, the tungsten film was selectively etched to form a source electrode layer 805a and a drain electrode layer 805b (see FIG. 16C).

Then, as a gate insulating film 809, a 20-nm-thick silicon oxynitride film was formed over the source electrode layer 805a and the drain electrode layer 805b by a CVD method.

Next, a 30-nm-thick tantalum nitride film and a 135-nm-thick tungsten film were formed over the gate insulation film 809. The tantalum nitride film was formed under the following conditions: a sputtering target of tantalum nitride was used; argon with a flow rate of 50 sccm and nitrogen with a flow rate of 10 sccm were supplied as a sputtering gas into a treatment chamber of a sputtering apparatus; the pressure in the treatment chamber was controlled to be 0.6 Pa; and the DC power of 1 kW was supplied. Note that when the tantalum nitride film was formed, a substrate temperature was set to room temperature. Further, the tungsten film was formed under the following conditions: a sputtering target of tungsten was used; argon with a flow rate of 100 sccm was supplied as a sputtering gas into a treatment chamber of a sputtering apparatus; the pressure in the treatment chamber was controlled to be 2.0 Pa; and the DC power of 4 kW was supplied. Note that the tungsten film was formed at 230° C. Then, the tantalum nitride film and the tungsten film were selectively etched to form a gate electrode layer 810.

Next, phosphorus (P) ions were added to the oxide semiconductor stacked film 804 by an ion implantation method using the gate electrode layer 810, the source electrode layer 805a, and the drain electrode layer 805b as masks. The conditions of the phosphorus (P) ion implantation were as follows: an acceleration voltage of 40 kV and a dosage of $1.0 \times 10^{15}$ ions/cm$^2$.

Next, as an insulating film 811, a 70-nm-thick aluminum oxide film was formed by a sputtering method and a 300-nm-thick silicon oxynitride film was formed by a CVD method. The aluminum oxide film was formed under the following conditions: argon with a flow rate of 25 sccm and oxygen with a flow rate of 25 sccm were supplied as a sputtering gas into a treatment chamber of a sputtering apparatus; the pressure in the treatment chamber was controlled to be 0.4 Pa; and the DC power of 2.5 kW was supplied. Note that the aluminum oxide film was formed at a substrate temperature of 250° C.

Next, the insulating film 811 was selectively etched to form openings which reach the source electrode layer 805a and the drain electrode layer 805b. After that, a 50-nm-thick titanium film, a 200-nm-thick aluminum film, and a 50-nm-thick titanium film were formed. The titanium films were formed under the following conditions: argon with a flow rate of 20 sccm was supplied as a sputtering gas into a treatment chamber of a sputtering apparatus; the pressure in the treatment chamber was 0.1 Pa; and the DC power of 12 kW was supplied. Note that when the titanium film was formed, a substrate temperature was set to at room temperature. Further, the aluminum film was formed under the following conditions: argon with a flow rate of 50 sccm was supplied as a sputtering gas into a treatment chamber of a sputtering apparatus; the pressure in the treatment chamber was 0.4 Pa; and the DC power of 1 kW was supplied. Then, the titanium film, the aluminum film, and the titanium film were selectively etched to form a wiring layer 812a and a wiring layer 812b (see FIG. 16D).

Through the above process, the sample C including the transistor was manufactured.

Next, a manufacturing process of the sample D including a transistor is described.

The sample D is the same as the sample C except for the structure of the oxide semiconductor stacked film 804; thus, only differences between the sample C and the sample D are described.

After oxygen was added to the base film 808, the first oxide semiconductor layer 803a, the second oxide semiconductor layer 803b, and the third oxide semiconductor layer 803c were formed.

As the first oxide semiconductor layer 803a, a 5-nm-thick IGZO layer having an atomic ratio of In:Ga:Zn=1:3:2 was formed. The IGZO layer having an atomic ratio of In:Ga:Zn=1:3:2 was formed under the following conditions: a sputtering target of In:Ga:Zn=1:3:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:3:2 was formed at a substrate temperature of 200° C.

Then, as the second oxide semiconductor layer 803b, a 15-nm-thick IGZO layer having an atomic ratio of In:Ga:Zn=3:1:2 was formed. The IGZO layer having an atomic ratio of In:Ga:Zn=3:1:2 was formed under the following conditions: a sputtering target of In:Ga:Zn=3:1:2 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=3:1:2 was formed at a substrate temperature of 300° C.

Then, as the third oxide semiconductor layer 803c, a 5-nm-thick IGZO layer having an atomic ratio of In:Ga:Zn=1:1:1 was formed. The IGZO layer having an atomic ratio of In:Ga:Zn=1:1:1 was formed under the following conditions: a sputtering target of In:Ga:Zn=1:1:1 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:1:1 was formed at a substrate temperature of 200° C.

Note that the first oxide semiconductor layer 803a, the second oxide semiconductor layer 803b, and the third oxide semiconductor layer 803c were successively formed without exposure to the air.

Steps after that were performed in a manner similar to the sample C, whereby the sample D including the transistor was manufactured.

Next, a manufacturing process of a sample E as a comparative example including a transistor is described.

The sample E is the same as the sample C except for the use of a single oxide semiconductor layer instead of stacked oxide semiconductor layers; thus, only differences between the sample C and the sample E are described.

After oxygen was added to the base film 808, the oxide semiconductor layer was formed.

Then, as the oxide semiconductor layer, a 15-nm-thick IGZO layer having an atomic ratio of In:Ga:Zn=1:1:1 was formed. The IGZO layer having an atomic ratio of In:Ga:Zn=1:1:1 was formed under the following conditions: a sputtering target of In:Ga:Zn=1:1:1 (atomic ratio) was used; argon with a flow rate of 30 sccm and oxygen with a flow rate of 15 sccm were supplied as a sputtering gas into a treatment chamber of a sputtering apparatus; the pressure in the treatment chamber was controlled to be 0.4 Pa; and a DC power of 0.5 kW was supplied. Note that the IGZO layer having an atomic ratio of In:Ga:Zn=1:1:1 was formed at a substrate temperature of 200° C.

Steps after that were performed in a manner similar to the sample C, whereby the sample E including the transistor was manufactured.

The channel length (L) of each of the transistors included in the sample C, the sample D, and the sample E was 0.6 μm and the channel width (W) thereof was 1.0 μm.

One of methods for examining reliability of transistors is a GBT test. The GBT test is one kind of accelerated test and a change in characteristics, caused by long-term use, of transistors can be evaluated in a short time. In particular, the amount of shift in threshold voltage of the transistor between before and after a GBT test is an important indicator for examining reliability. The smaller the shift in the threshold voltage between before and after a GBT test is, the higher the reliability of the transistor is.

The temperature of a substrate over which a transistor is formed is set at a fixed temperature. A source and a drain of the transistor are set at the same potential, and a gate is supplied with a potential different from those of the source and the drain for a certain period. The temperature of the substrate may be determined depending on the purpose of the test. Further, the potential applied to the gate is higher than the potential of the source and the drain (the potential of the source and the drain is the same) in a "+GBT test" while the potential applied to the gate is lower than the potential of the source and the drain (the potential of the source and the drain is the same) in a "−GBT test."

Strength of the GBT test may be determined based on the temperature of a substrate and electric field intensity and time period of application of the electric field to a gate insulating layer. The electric field intensity in the gate insulating layer is determined as the value of a potential difference between a gate, and a source and a drain divided by the value of the thickness of the gate insulating layer.

In this example, a positive GBT test was performed on each of the transistors included in the sample C, the sample D, and the sample E. First, initial Vg-Id characteristics of the transistor were measured. Here, a change in characteristics of the source-drain current (hereinafter, referred to as the drain current), that is, Vg-Id characteristics were measured under the conditions as follows: the substrate temperature was 40° C., the voltages between the source and the drain (hereinafter, referred to as the drain voltage) were 0.1 V and 3.3 V, and the voltage between the source and the gate electrode (hereinafter, referred to as the gate voltage) was changed from −4 V to +4 V.

Next, the substrate temperature was raised to 150° C., and then, the potentials of the source and the drain of the transistor were set to 0 V. Then, the voltage of +3.3 V was kept being applied to the gate electrode for one hour so that the intensity of the electric field applied to the gate insulating film was +1.65 MV/cm. After that, the substrate temperature was lowered to 40° C. while voltage was continuously applied to the gate electrode, and the source and the drain. After the substrate temperature was reached to 40° C., the application of voltage to the gate electrode, and the source and the drain was stopped.

Then, Vg-Id characteristics were measured under the same conditions as those for the measurement of the initial characteristics.

Next, a negative GBT test was performed on each of the transistors included in the sample C, the sample D, and the sample E. First, initial Vg-Id characteristics of the transistor were measured. In a manner similar to the positive GBT test, a change in characteristics of the drain current, that is, Vg-Id characteristics were measured under the conditions as follows: the substrate temperature was 40° C., the drain voltages were 0.1 V and 3.3 V, and the gate voltage was changed from −4 V to +4 V.

Next, the substrate temperature was raised to 150° C., and then, the potentials of the source and the drain of the transistor were set to 0 V. Then, −3.3 V was kept being applied to the gate electrode for one hour so that the intensity of the electric field applied to the gate insulating film was −1.65 MV/cm. After that, the substrate temperature was lowered to 40° C. while voltage was continuously applied to the gate electrode, and the source and the drain. After the substrate temperature was reached to 40° C., the application of voltage to the gate electrode, and the source and the drain was stopped.

Then, Vg-Id characteristics were measured under the same conditions as those for the measurement of the initial characteristics.

Figure 17A:
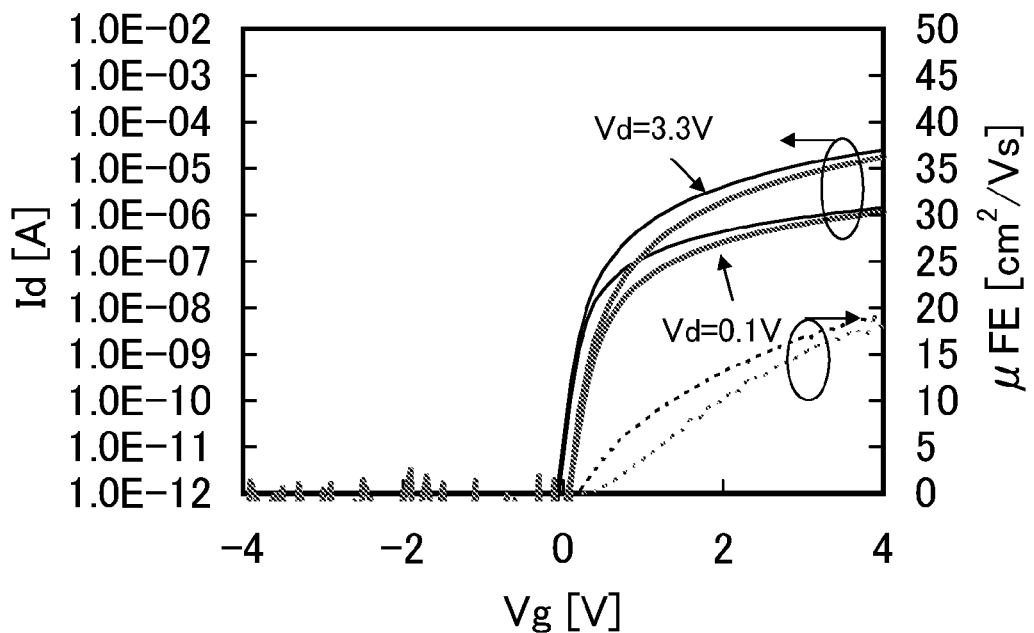
FIGS. 17A and 17B each show Vg-Id characteristics of a transistor included in a sample C.
Figure 17B:
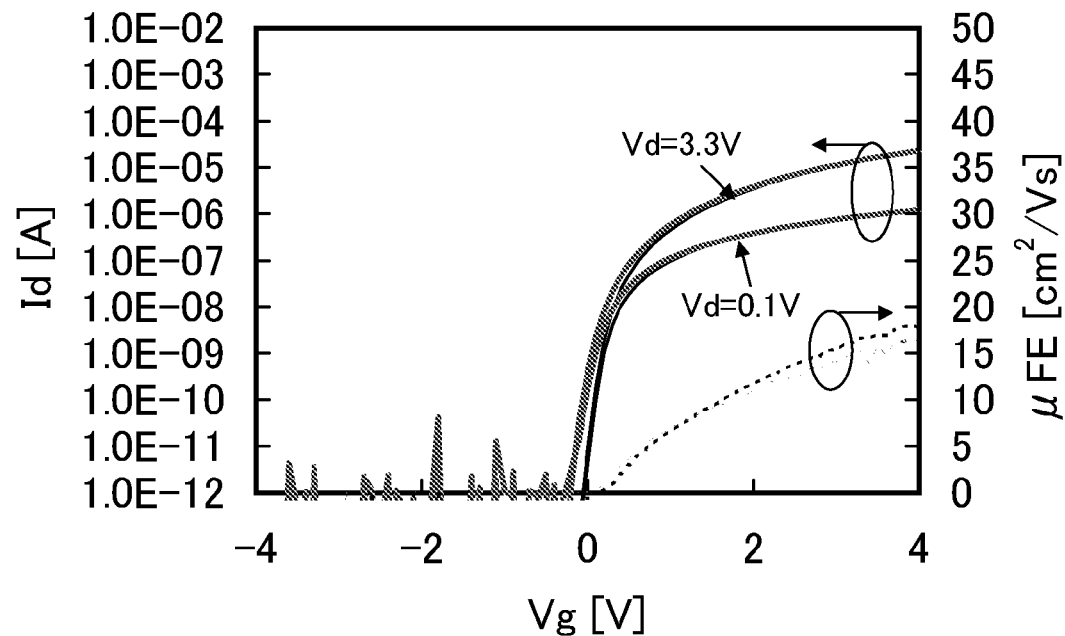
Figure 18A:
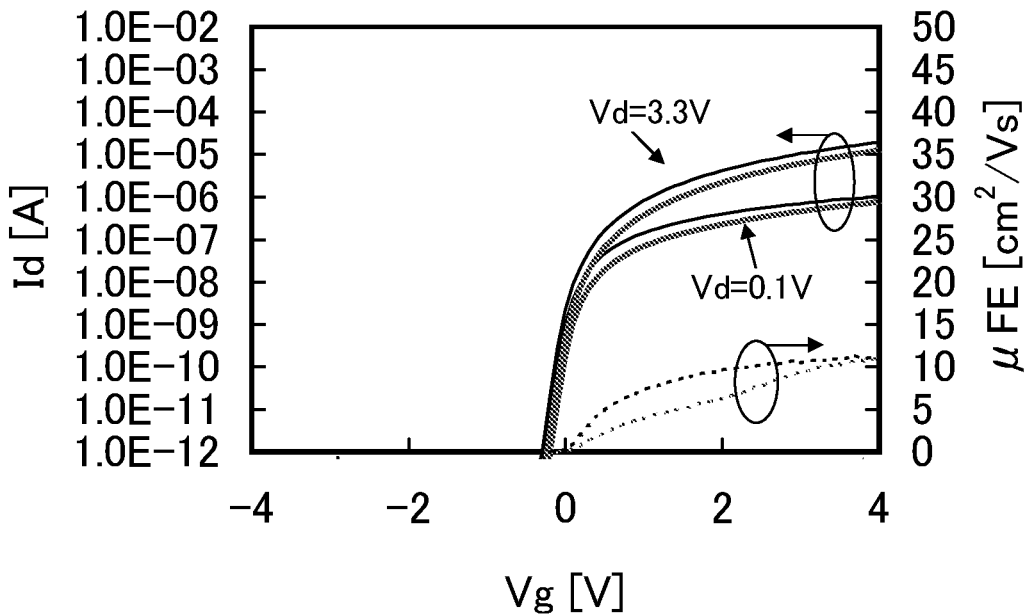
FIGS. 18A and 18B each show Vg-Id characteristics of a transistor included in a sample D.
Figure 18B:
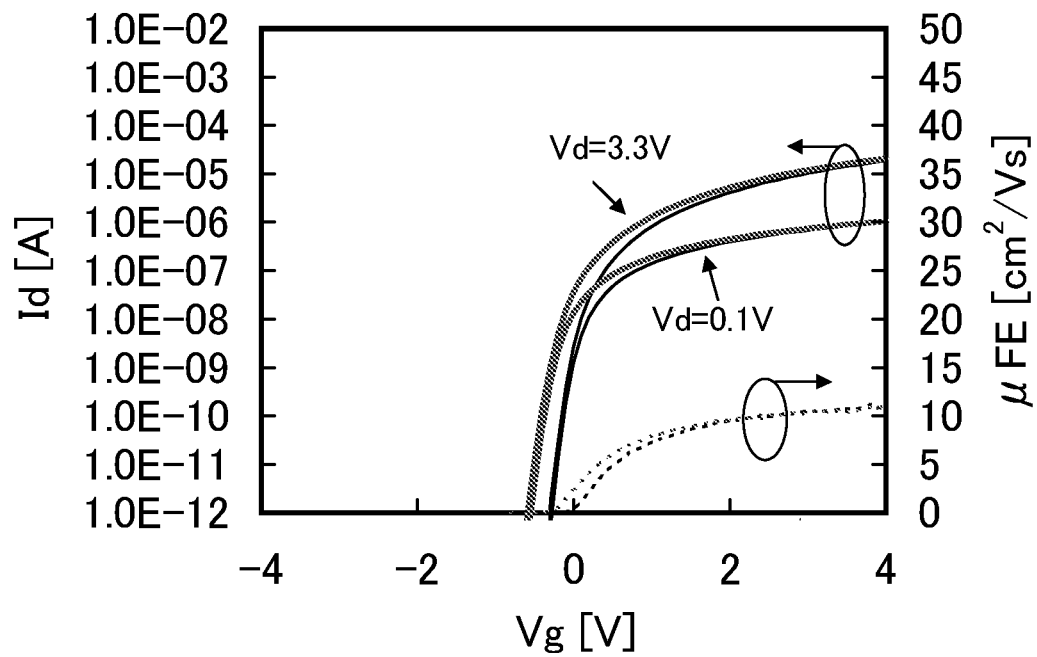
Figure 19A:
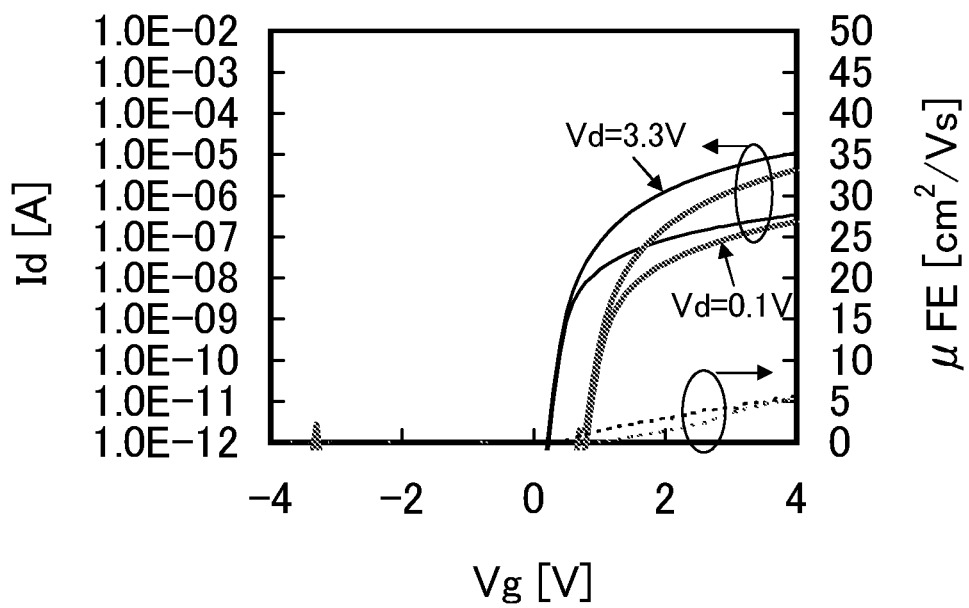
FIGS. 19A and 19B each show Vg-Id characteristics of a transistor included in a sample E.
Figure 19B:
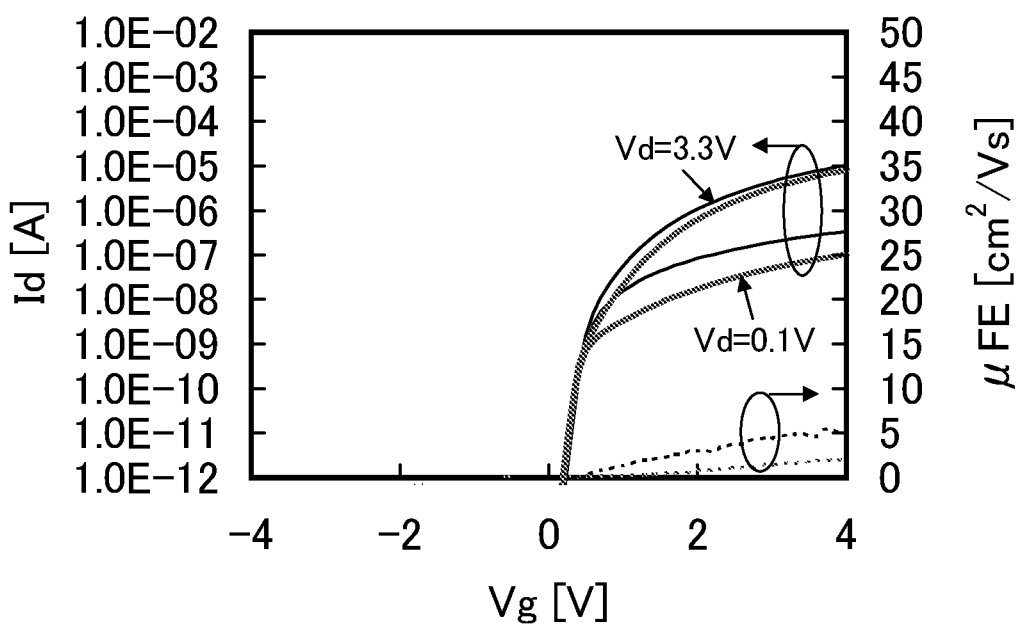

FIGS. 17A and 17B, FIGS. 18A and 18B, and FIGS. 19A and 19B show results of the positive GBT test and the negative GBT test of the transistors included in the sample C, the sample D, and the sample E. FIG. 17A shows results of the positive GBT test of the transistor included in the sample C and FIG. 17B shows results of the negative GBT test of the transistor included in the sample C. FIG. 18A shows results of the positive GBT test of the transistor included in the sample D and FIG. 18B shows results of the negative GBT test of the transistor included in the sample D. FIG. 19A shows results of the positive GBT test of the transistor included in the sample E and FIG. 19B shows results of the negative GBT test of the transistor included in the sample E.

In FIGS. 17A and 17B, FIGS. 18A and 18B, and FIGS. 19A and 19B, a thin line represents results before a GBT test and a thick line represents results after the GBT test.

As shown in FIGS. 17A and 17B and FIGS. 18A and 18B, a change in the threshold voltage through the positive GBT test and the negative GBT test is hardly observed in each of the transistors included in the sample C and the sample D. In contrast, as illustrated in FIGS. 19A and 19B, in the transistor included in the sample E, a change in the threshold voltage due to the positive GBT test is found. Further, in the transistor included in the sample E, a reduction in on-state current is also found. Consequently, it was confirmed that the degree of changes in the threshold voltage through the GBT test is small and reliability is high in the transistors included in the example C and the sample D.

Example 3

In this example, the measurement results of the conductivity of the oxide semiconductor included in the oxide semiconductor stacked film of one embodiment of the present invention are described.

In this example, an oxide semiconductor layer using a target having an atomic ratio of In:Ga:Zn=1:1:1, an oxide semiconductor layer using a target having an atomic ratio of In:Ga:Zn=3:1:2, and an oxide semiconductor layer using a target having an atomic ratio of In:Ga:Zn=1:3:2 were formed. After heat treatment was performed on the formed oxide semiconductor layers, the conductivities of the oxide semiconductor layers were measured by equipment used for Hall effect measurement. Further, a silicon oxide film was further formed over each of the oxide semiconductor layers and heat treatment was performed thereon, and then the conductivities of the oxide semiconductor layers were measured. Note that in this example, an IGZO layer having an atomic ratio of In:Ga:Zn=1:1:1, an IGZO layer having an atomic ratio of In:Ga:Zn=3:1:2, and an IGZO layer having an atomic ratio of In:Ga:Zn=1:3:2 are referred to as a first IGZO layer, a second IGZO layer, and a third IGZO layer, respectively.

A 100-nm-thick first IGZO layer was formed over a glass substrate. The first IGZO layer was formed under the following conditions: a sputtering target of In:Ga:Zn=1:1:1 (atomic ratio) was used; oxygen with a flow rate of 45 sccm was supplied as a sputtering gas into a treatment chamber of a sputtering apparatus; the pressure in the treatment chamber was controlled to be 0.4 Pa; and a DC power of 0.5 kW was supplied. Note that the first IGZO layer was formed at a substrate temperature of 300° C.

Then, heat treatment was performed. The heat treatment was performed at 450° C. under a nitrogen atmosphere for one hour, and then in dry air (under a dry atmosphere) for one hour.

Next, a 100-nm-thick tungsten film was formed over the first IGZO layer. The tungsten film was formed under the following conditions: a sputtering target of tungsten was used; argon with a flow rate of 80 sccm was supplied as a sputtering gas into a treatment chamber of a sputtering apparatus; the pressure in the treatment chamber was controlled to be 0.8 Pa; and a DC power of 1 kW was supplied. Note that the tungsten film was formed at 230° C. Then, the tungsten film was selectively etched to form an electrode layer.

Here, the conductivity of the first IGZO layer was measured by the equipment used for Hall effect measurement.

Next, a silicon oxide film was formed over the first IGZO layer and the electrode layer. The silicon oxide film was formed under the following conditions: a sputtering target of silicon oxide was used; oxygen with a flow rate of 50 sccm was supplied as a sputtering gas into a treatment chamber of a sputtering apparatus; the pressure in the treatment chamber was controlled to be 0.4 Pa; and a DC power of 1.5 kW was supplied. Note that the silicon oxide film was formed at a substrate temperature of 100° C.

After the formation of the silicon oxide film, heat treatment was performed. The heat treatment was performed at 300° C. in dry air (under a dry atmosphere) for one hour.

After that, the conductivity of the first IGZO layer was measured by the equipment used for Hall effect measurement.

In a manner similar to the first IGZO layer, a 100-nm-thick second IGZO layer was formed over the glass substrate. The second IGZO layer was formed under the following conditions: a sputtering target of In:Ga:Zn=3:1:2 (atomic ratio) was used; oxygen with a flow rate of 45 sccm was supplied as a sputtering gas into a treatment chamber of a sputtering apparatus; the pressure in the treatment chamber was controlled to be 0.4 Pa; and a DC power of 0.5 kW was supplied. Note that the second IGZO layer was formed at a substrate temperature of 300° C.

Here, the conductivity of the second IGZO layer was measured by the equipment used for Hall effect measurement.

Next, a silicon oxide film was formed over the first and second IGZO layers and the electrode layer. The silicon oxide film was formed under the following conditions: a sputtering target of silicon oxide was used; oxygen with a flow rate of 50 sccm was supplied as a sputtering gas into a treatment chamber of a sputtering apparatus; the pressure in the treatment chamber was controlled to be 0.4 Pa; and a DC power of 1.5 kW was supplied. Note that the silicon oxide film was formed at a substrate temperature of 100° C.

After the formation of the silicon oxide film, heat treatment was performed. The heat treatment was performed at 300° C. in dry air (under a dry atmosphere) for one hour.

After that, the conductivity of the second IGZO layer was measured by the equipment used for Hall effect measurement.

In a manner similar to the first IGZO layer and the second IGZO layer, a 100-nm-thick third IGZO layer was formed over the glass substrate. The third IGZO layer was formed under the following conditions: a sputtering target of In:Ga:Zn=1:3:2 (atomic ratio) was used; oxygen with a flow rate of 45 sccm was supplied as a sputtering gas into a treatment chamber of a sputtering apparatus; the pressure in the treatment chamber was controlled to be 0.4 Pa; and a DC power of 0.5 kW was supplied. Note that the third IGZO layer was formed at a substrate temperature of 200° C.

Here, the conductivity of the third IGZO layer was measured by the equipment used for Hall effect measurement.

Next, a silicon oxide film was formed over the first, second, and third IGZO layers and the electrode layer. The silicon oxide film was formed under the following conditions: a sputtering target of silicon oxide was used; oxygen with a flow rate of 50 sccm was supplied as a sputtering gas into a treatment chamber of a sputtering apparatus; the pressure in the treatment chamber was controlled to be 0.4 Pa; and a DC power of 1.5 kW was supplied. Note that the silicon oxide film was formed at a substrate temperature of 100° C.

After the formation of the silicon oxide film, heat treatment was performed. The heat treatment was performed at 200° C. in dry air (under a dry atmosphere) for one hour.

After that, the conductivity of the third IGZO layer was measured by the equipment used for Hall effect measurement.

Table 1 shows the measurement results of the conductivities of the first IGZO layer, the second IGZO layer, and the third IGZO layer by using the equipment used for Hall effect measurement.

TABLE 1

| | Hall effect measurement 1 Conductivity [S/cm] | Hall effect measurement 2 Conductivity [S/cm] |
|---|---|---|
| First IGZO layer | $4.5 \times 10^{-1}$ | $6.7 \times 10^{-5}$ |
| Second IGZO layer | 9.7 | 2 |
| Third IGZO layer | $8.1 \times 10^{-9}$ (below the lower limit of measurement) | $1.6 \times 10^{-8}$ (below the lower limit of measurement) |

As seen from Table 1, the conductivities of the first IGZO layer and the second IGZO layer can be higher than that of the third IGZO layer.

Explanation of Reference

100: substrate, 101: oxide semiconductor stacked film, 101a: oxide semiconductor layer, 101b: oxide semiconductor layer, 101b1: oxide semiconductor layer, 101b2: oxide semiconductor layer, 101c: oxide semiconductor layer, 111: oxide semiconductor layer, 112a: oxide semiconductor layer, 112b: oxide semiconductor layer, 113a: oxide semiconductor layer, 113b: oxide semiconductor layer, 113c: oxide semiconductor layer, 121: insulating film, 122: insulating film, 201: lamp, 202: monochromator, 203: filter, 204: beam splitter, 205: photodiode, 206: direct-current power source, 207: lock-in amplifier, 208: calculator, 209: lock-in amplifier, 210: sample, 211a: electrode, 211b: electrode, 310: transistor, 320: transistor, 330: transistor, 340: transistor, 350: transistor, 360: transistor, 370: transistor, 380: transistor, 390: transistor, 400: substrate, 401: gate electrode layer, 402: gate insulating film, 403a: oxide semiconductor layer, 403b: oxide semiconductor layer, 403c: oxide semiconductor layer, 404: oxide semiconductor stacked film, 404a: oxide semiconductor layer, 404b: oxide semiconductor layer, 404c: oxide semiconductor layer, 405a: source electrode layer, 405b: drain electrode layer, 406: insulating film, 407: electrode layer, 408: insulating film, 409: gate insulating film, 410: gate electrode layer, 411: oxide semiconductor layer, 450: transistor, 460: transistor, 700: glass substrate, 701a: oxide semiconductor layer, 701b: oxide semiconductor layer, 701c: oxide semiconductor layer, 705a: electrode layer, 705b: electrode layer, 706: insulating film, 800: substrate, 803a: oxide semiconductor layer, 803b: oxide semiconductor layer, 803c: oxide semiconductor layer, 804: oxide semiconductor stacked film, 804a: oxide semiconductor layer, 804c: oxide semiconductor layer, 805a: source electrode layer, 805b: drain electrode layer, 808: base film, 809: gate insulating film, 810: gate electrode layer, 811: insulating film, 812a: wiring layer, 812b: wiring layer, 9000: table, 9001: housing, 9002: leg portion, 9003: display portion, 9004: displayed button, 9005: power cord, 9033: clip, 9034: switch, 9035: power button, 9036: switch, 9038: operation button, 9100: television set, 9101: housing, 9103: display portion, 9105: stand, 9107: display portion, 9109: operation key, 9110: remote controller, 9201: main body, 9202: housing, 9203: display portion, 9204: keyboard, 9205: external connection port, 9206: pointing device, 9630: housing, 9631: display portion, 9631a: display portion, 9631b: display portion, 9632a: region, 9632b: region, 9633: solar battery, 9634: charge and discharge control circuit, 9635: battery, 9636: DCDC converter, 9637: converter, 9638: operation key, 9639: button.

This application is based on Japanese Patent Application serial no. 2012-173388 filed with Japan Patent Office on Aug. 3, 2012, the entire contents of which are hereby incorporated by reference.

The invention claimed is:

1. A semiconductor device comprising:
    a first gate electrode layer;
    a first insulating film over the first gate electrode layer;
    an oxide semiconductor stacked film over the first insulating film; and
    a pair of electrode layers in contact with the oxide semiconductor stacked film,
    wherein the oxide semiconductor stacked film comprises:
        a first oxide semiconductor layer;
        a second oxide semiconductor layer over the first oxide semiconductor layer; and
        a third oxide semiconductor layer over the second oxide semiconductor layer,
    wherein each of the first oxide semiconductor layer, the second oxide semiconductor layer, and the third oxide semiconductor layer comprises indium,
    wherein a content percentage of indium in the second oxide semiconductor layer is higher than a content percentage of indium in the first oxide semiconductor layer and a content percentage of indium in the third oxide semiconductor layer, wherein an absorption coefficient of a channel formation region in the oxide semiconductor stacked film, which is measured by the CPM, is lower than or equal to $3\times10^{-3}$/cm in an energy range of 1.5 eV to 2.3 eV, and wherein a conduction band of each of the first oxide semiconductor layer and the third oxide semiconductor layer is higher than a conduction band of the second oxide semiconductor layer.

2. The semiconductor device according to claim 1, wherein the second oxide semiconductor layer comprises a crystal part whose c-axis is substantially perpendicular to a surface of the oxide semiconductor stacked film.

3. The semiconductor device according to claim 1,
wherein the second oxide semiconductor layer further comprises gallium, and
wherein in the second oxide semiconductor layer, the content percentage of indium is higher than a content percentage of gallium.

4. The semiconductor device according to claim 1, wherein the second oxide semiconductor layer has a stacked-layer structure.

5. The semiconductor device according to claim 1, wherein a conductivity of the second oxide semiconductor layer is higher than a conductivity of the first oxide semiconductor layer and a conductivity of the third oxide semiconductor layer.

6. The semiconductor device according to claim 1 further comprising an oxide insulating film over the pair of electrode layers and the oxide semiconductor stacked film.

7. The semiconductor device according to claim 1 further comprising:
a second insulating film over the pair of electrode layers and the oxide semiconductor stacked film, and
a second gate electrode layer over the second insulating film.

8. The semiconductor device according to claim 1, wherein each of the first oxide semiconductor layer, the second oxide semiconductor layer, and the third oxide semiconductor layer further comprises gallium and zinc.

9. A semiconductor device comprising:
an oxide semiconductor stacked film;
a pair of electrode layers in contact with the oxide semiconductor stacked film;
a gate insulating film over the oxide semiconductor stacked film; and
a gate electrode layer over the gate insulating film,
wherein the oxide semiconductor stacked film comprises:
a first oxide semiconductor layer;
a second oxide semiconductor layer over the first oxide semiconductor layer; and
a third oxide semiconductor layer over the second oxide semiconductor layer,
wherein each of the first oxide semiconductor layer, the second oxide semiconductor layer, and the third oxide semiconductor layer comprises indium,
wherein a content percentage of indium in the second oxide semiconductor layer is higher than a content percentage of indium in the first oxide semiconductor layer and a content percentage of indium in the third oxide semiconductor layer,
wherein an absorption coefficient of a channel formation region in the oxide semiconductor stacked film, which is measured by the CPM, is lower than or equal to $3\times10^{-3}$/cm in an energy range of 1.5 eV to 2.3 eV, and
wherein a conduction band of each of the first oxide semiconductor layer and the third oxide semiconductor layer is higher than a conduction band of the second oxide semiconductor layer.

10. The semiconductor device according to claim 9, wherein the second oxide semiconductor layer comprises a crystal part whose c-axis is substantially perpendicular to a surface of the oxide semiconductor stacked film.

11. The semiconductor device according to claim 9,
wherein the second oxide semiconductor layer further comprises gallium, and
wherein in the second oxide semiconductor layer, the content percentage of indium is higher than a content percentage of gallium.

12. The semiconductor device according to claim 9, wherein the second oxide semiconductor layer has a stacked-layer structure.

13. The semiconductor device according to claim 9, wherein a conductivity of the second oxide semiconductor layer is higher than a conductivity of the first oxide semiconductor layer and a conductivity of the third oxide semiconductor layer.

14. The semiconductor device according to claim 9 further comprising an oxide insulating film over the pair of electrode layers and the oxide semiconductor stacked film.

15. The semiconductor device according to claim 9, wherein each of the first oxide semiconductor layer, the second oxide semiconductor layer, and the third oxide semiconductor layer further comprises gallium and zinc.

* * * * *